US010121794B2

(12) United States Patent
Gunji-Yoneoka et al.

(10) Patent No.: US 10,121,794 B2
(45) Date of Patent: Nov. 6, 2018

(54) THREE-DIMENSIONAL MEMORY DEVICE HAVING EPITAXIAL GERMANIUM-CONTAINING VERTICAL CHANNEL AND METHOD OF MAKING THEREOF

(71) Applicant: SANDISK TECHNOLOGIES LLC, Plano, TX (US)

(72) Inventors: Marika Gunji-Yoneoka, Sunnyvale, CA (US); Atsushi Suyama, Yokkaichi (JP); Jayavel Pachamuthu, San Jose, CA (US); Tsuyoshi Hada, Yokkaichi (JP); Daewung Kang, Milpitas, CA (US); Murshed Chowdhury, Fremont, CA (US); James Kai, Santa Clara, CA (US); Hiro Kinoshita, San Jose, CA (US); Tomoyuki Obu, Yokkaichi (JP); Luckshitha Suriyasena Liyanage, Standford, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 15/279,959

(22) Filed: Sep. 29, 2016

(65) Prior Publication Data
US 2017/0365613 A1    Dec. 21, 2017

Related U.S. Application Data

(60) Provisional application No. 62/352,286, filed on Jun. 20, 2016.

(51) Int. Cl.
*H01L 27/115*       (2017.01)
*H01L 27/11556*    (2017.01)
(Continued)

(52) U.S. Cl.
CPC .... *H01L 27/11556* (2013.01); *H01L 27/1157* (2013.01); *H01L 27/11524* (2013.01); *H01L 27/11582* (2013.01)

(58) Field of Classification Search
CPC .......... H01L 27/11273; H01L 27/1128; H01L 27/11514; H01L 27/11551;
(Continued)

(56) References Cited

U.S. PATENT DOCUMENTS 5,915,167 A   6/1999   Leedy
6,998,305 B2   2/2006   Arena et al.
(Continued)

FOREIGN PATENT DOCUMENTS

WO    WO2002/015277 A2    2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Jose R Diaz
(74) *Attorney, Agent, or Firm* — The Marbury Law Group PLLC

(57) ABSTRACT

An alternating stack of insulating layers and spacer material layers is formed over a semiconductor substrate. Memory openings are formed through the alternating stack. An optional silicon-containing epitaxial pedestal and a memory film are formed in each memory opening. After forming an opening through a bottom portion of the memory film within each memory opening, a germanium-containing semiconductor layer and a dielectric layer is formed in each memory opening. Employing the memory film and the dielectric layer as a crucible, a liquid phase epitaxy anneal is per- (Continued)

formed to convert the germanium-containing semiconductor layer into a germanium-containing epitaxial channel layer. A dielectric core and a drain region can be formed over the dielectric layer. The germanium-containing epitaxial channel layer is single crystalline, and can provide a higher charge carrier mobility than a polysilicon channel.

18 Claims, 24 Drawing Sheets

(51) Int. Cl.
   *H01L 27/11524* (2017.01)
   *H01L 27/11582* (2017.01)
   *H01L 27/1157* (2017.01)

(58) Field of Classification Search
   CPC ......... H01L 27/11553; H01L 27/11556; H01L 27/11578; H01L 27/1158; H01L 27/11582
   See application file for complete search history.

(56) References Cited

U.S. PATENT DOCUMENTS

| | | |
|---|---|---|
| 7,005,350 B2 | 2/2006 | Walker et al. |
| 7,023,739 B2 | 4/2006 | Chen et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,696,559 B2 | 4/2010 | Arai et al. |
| 7,745,265 B2 | 6/2010 | Mokhlesi et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,349,681 B2 | 1/2013 | Alsmeier et al. |
| 8,394,681 B2 | 1/2013 | Alsmeier et al. |
| 8,394,716 B2 | 3/2013 | Hwang et al. |
| 8,614,126 B1 | 12/2013 | Lee et al. |
| 8,658,499 B2 | 2/2014 | Makala et al. |
| 8,946,023 B2 | 2/2015 | Makala et al. |
| 9,023,719 B2 | 5/2015 | Pachamuthu et al. |
| 9,230,980 B2 | 1/2016 | Rabkin et al. |
| 9,331,093 B2 | 5/2016 | Rabkin et al. |
| 9,397,093 B2 | 7/2016 | Makala et al. |
| 9,449,983 B2 | 9/2016 | Yada et al. |
| 2007/0210338 A1 | 9/2007 | Orlowski |
| 2007/0252201 A1 | 11/2007 | Kito et al. |
| 2009/0101969 A1 | 4/2009 | Katsumata et al. |
| 2009/0230449 A1 | 9/2009 | Sakaguchi et al. |
| 2009/0242967 A1 | 10/2009 | Katsumata et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0140685 A1 | 6/2010 | Kang et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0258852 A1 | 10/2010 | Lim et al. |
| 2010/0320528 A1 | 12/2010 | Jeong et al. |
| 2011/0076819 A1 | 3/2011 | Kim et al. |
| 2011/0133606 A1 | 6/2011 | Yoshida et al. |
| 2011/0266606 A1 | 11/2011 | Park et al. |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0012920 A1 | 1/2012 | Shin et al. |
| 2012/0256247 A1 | 10/2012 | Alsmeier |
| 2013/0248974 A1 | 9/2013 | Alsmeier et al. |
| 2013/0264631 A1 | 10/2013 | Alsmeier et al. |
| 2013/0313627 A1 | 11/2013 | Lee et al. |
| 2015/0076580 A1 | 3/2015 | Pachamuthu et al. |
| 2015/0076584 A1 | 3/2015 | Pachamuthu et al. |
| 2015/0076586 A1* | 3/2015 | Rabkin ............. G11C 16/0483 257/324 |
| 2016/0056169 A1* | 2/2016 | Lee .................. H01L 27/11565 438/269 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, M. "3D Cells Make Terabit NAND Flash Possible," Nikkei Electronics Asia, Sep. 17, 2009, 6pgs.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.ip/english/NEWS_EN/20090619/171977/ Nikkei Microdevices, Tech-On, Jun. 19, 2009.

Li et al., "Sacrificial Polymers for Nanofluidic Channels in Biological Applications", Nanotechnology 14 (2003) 578-583.

Invitation to pay additional fees and partial international search report received in connection with international application No. PCT/US2014/054246; dated Dec. 3, 2014.

International Search Report and Written Opinion received in connection with international application No. PCT/US2014/054246; dated Feb. 13, 2015.

Jung et al., "Implementation of Both High-Hole and Electron Mobility in Strained Si/Strained $Si_{1-y}Ge_y$ on Relaxed $Si_{1-x}Ge_x$ (x<y) Virtual Substrate," IEEE Electron Device Letters, vol. 24, No. 7, Jul. 2003.

Watakabe et al., "Electrical and Structural Properties of Poly-SiGe Film Formed by Pulsed-Laser Annealing," Journal of Applied Physics, vol. 95, No. 11, Jun. 2004.

Datta et al., "Advanced Si and SiGe Strained Channel NMOS and PMOS Transistors with High-K/Metal-Gate Stack," IEEE BCTM 10.2, 2004.

Jin et al., "High-Performance Polycrystalline SiGe Thin-Film Transistors Using $Al_2O_3$ Gate Insulators," IEEE Electron Device Letters, vol. 19, No. 12, Dec. 1998.

Irisawa, T. et al., "Ultrahigh Room-Temperature Hole Hall and Effective Mobility in Si0.3Ge0.7/Ge/Si0.3Ge0.7 Heterostructures," Applied Physics Letters, vol. 81, No. 5, pp. 847-849, (2002).

Liu, Y. et al., "High-quality single-crystal Ge on insulator by liquid-phase epitaxy on Si substrates," Applied Physics Letters 84, No. 14, pp. 2563-2565 (2004).

Zhang, R. et al., Impact of Channel Orientation on Electrical Properties of Ge p- and n-MOSFETs With 1-nm EOT Al2O3/GeOx/Ge Gate-Stacks Fabricated by Plasma Postoxidation, IEEE Transactions on Electron Devices, vol. 61, No. 11, pp. 3668-3675, (2014).

Zhang, R. et al., "$Al_2O_3$ / $GeO_x$ / Ge gate stacks with low interface trap density fabricated by electron cyclotron resonance plasma postoxidation," Applied Physics Letters, vol. 98, pp. 112902-1-112902-3, (2011).

(56) References Cited

OTHER PUBLICATIONS

Kim, W. K. et al., "Properties of Ultrathin-Body Condensation Ge-On-Insulator Films Thinned by Additional Thermal Oxidation," Japanese Journal of Applied Physics, vol. 54, 7 pages, (2015).
Olesinski, R. W. et al., "The Ge-Si (Germanium-Silicon) System," Bulletin of Alloy Phase Diagrams, vol. 5, No. 2, 4 pages, (1984).
Kuhn, K. J. et al., "Past, Present and Future: SiGe and CMOS Transistor Scaling," ECS Transactions, vol. 33, No. 6, 15 pages, (2010).
Gleskova, H. et al., "Field-Effect Mobility of Amorphous Silicon Thin-Film Transistors Understand Strain," Journal of Non-Crystalline Solids, 4 pages, (2004).

\* cited by examiner

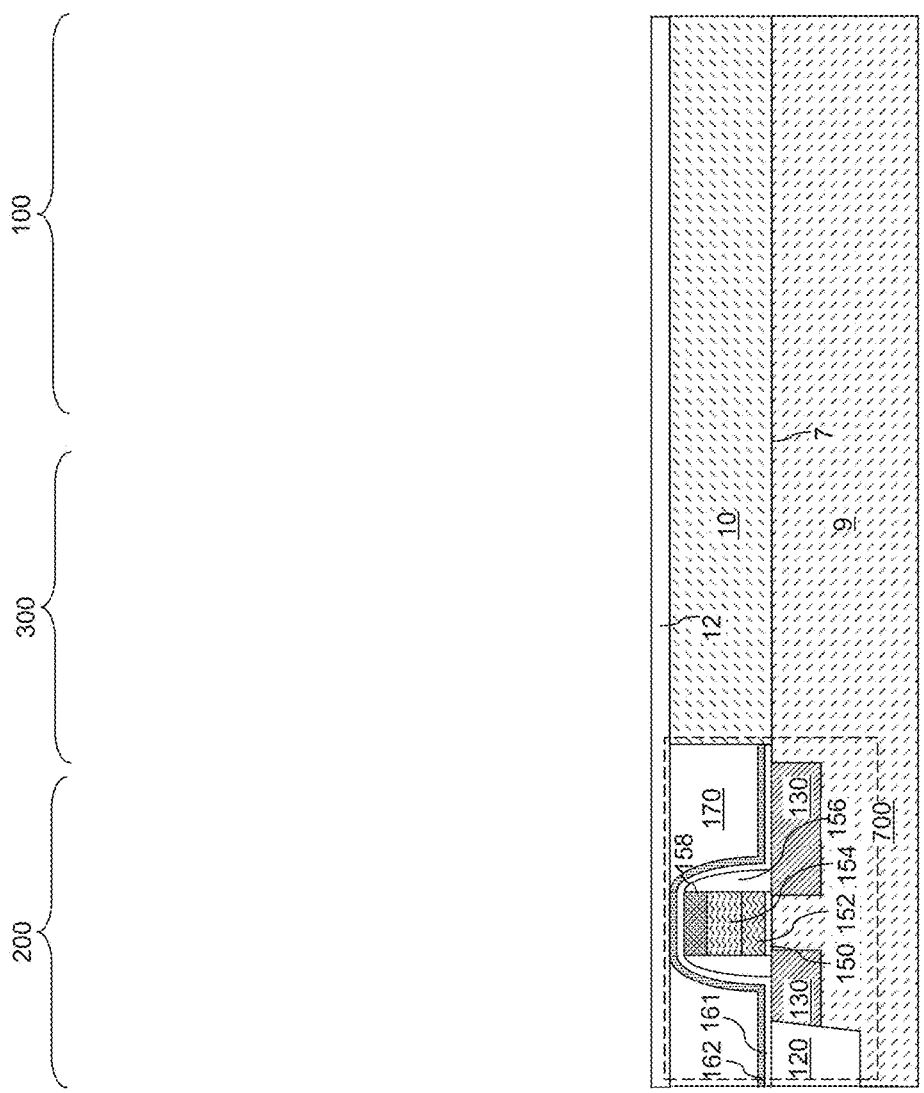

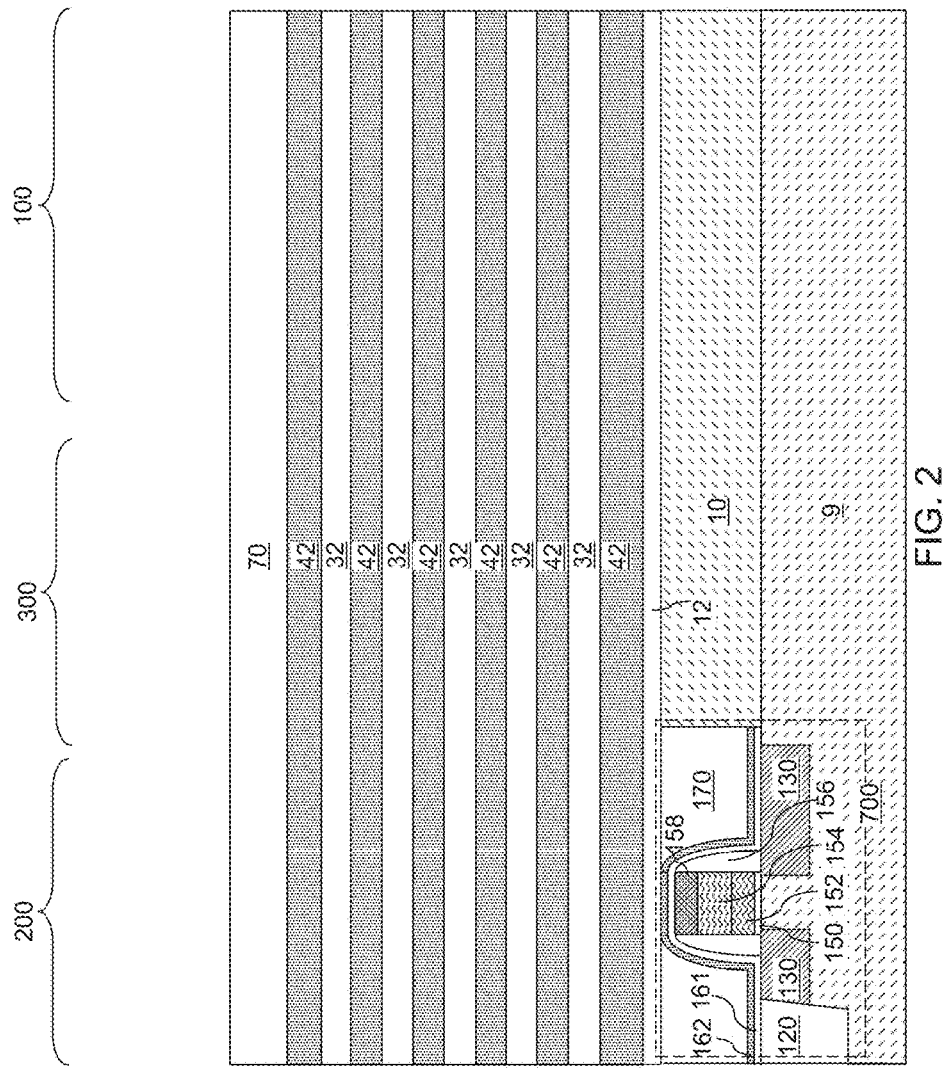

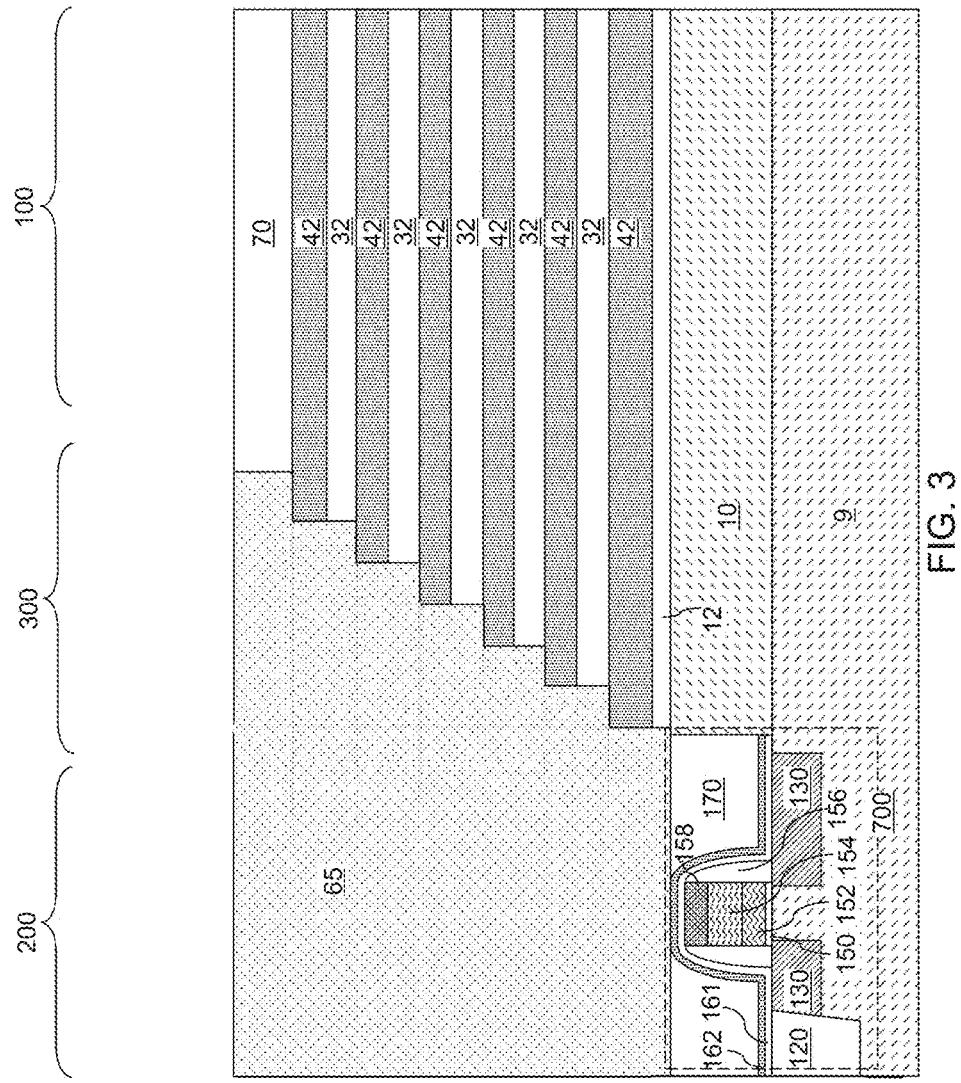

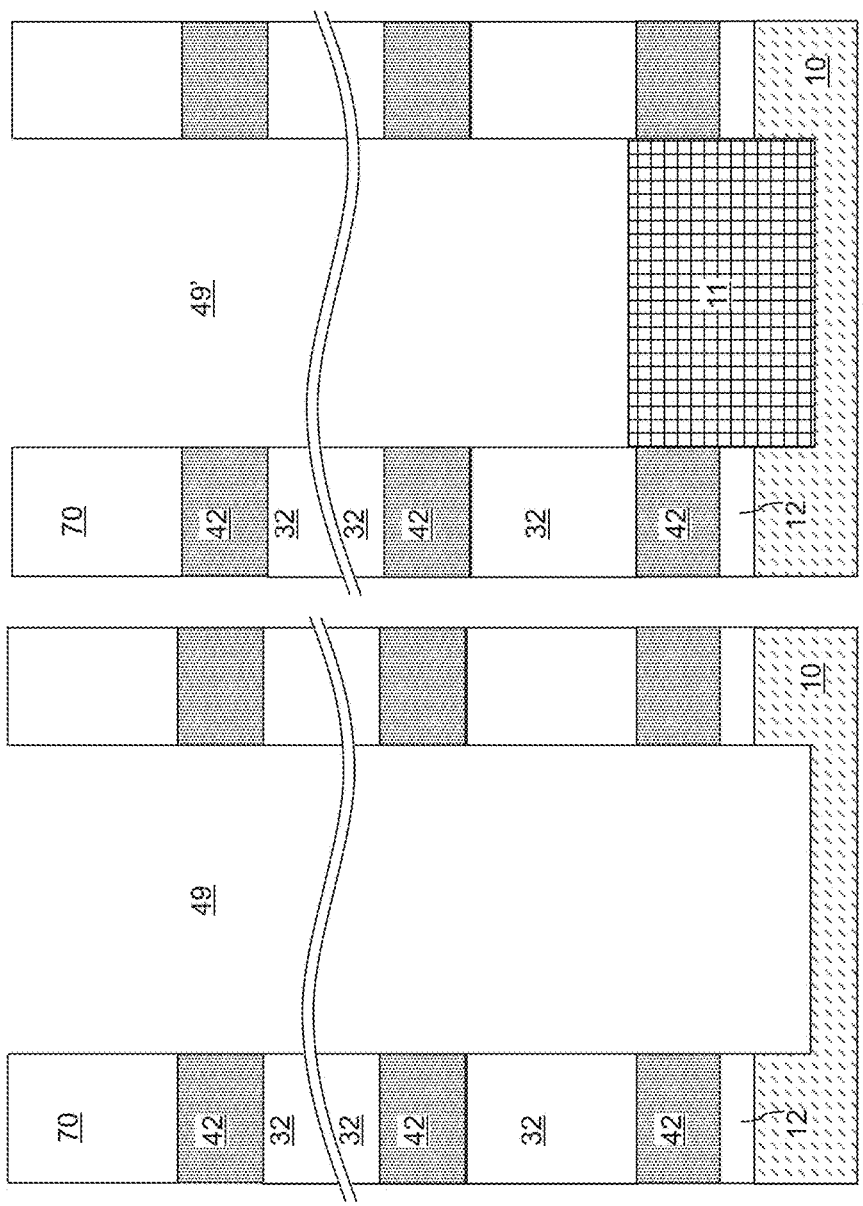

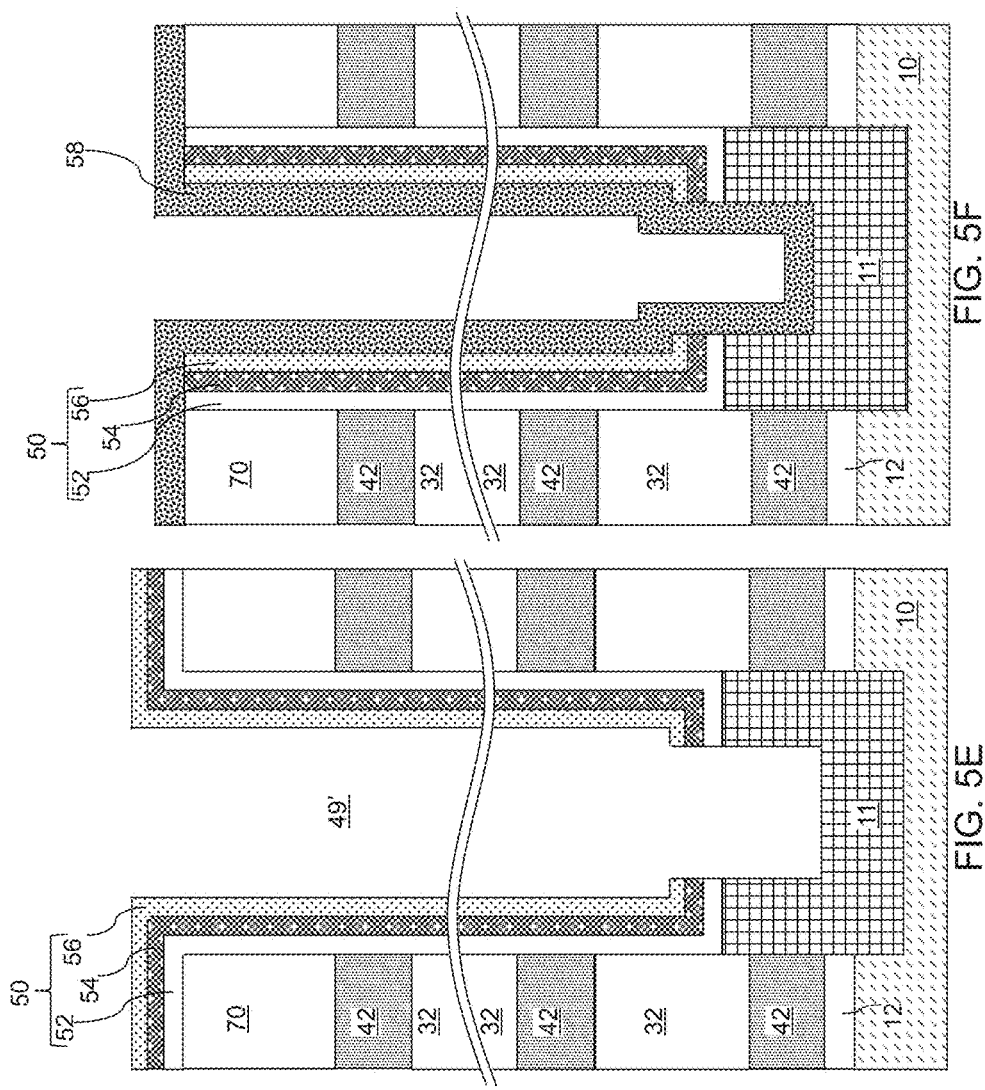

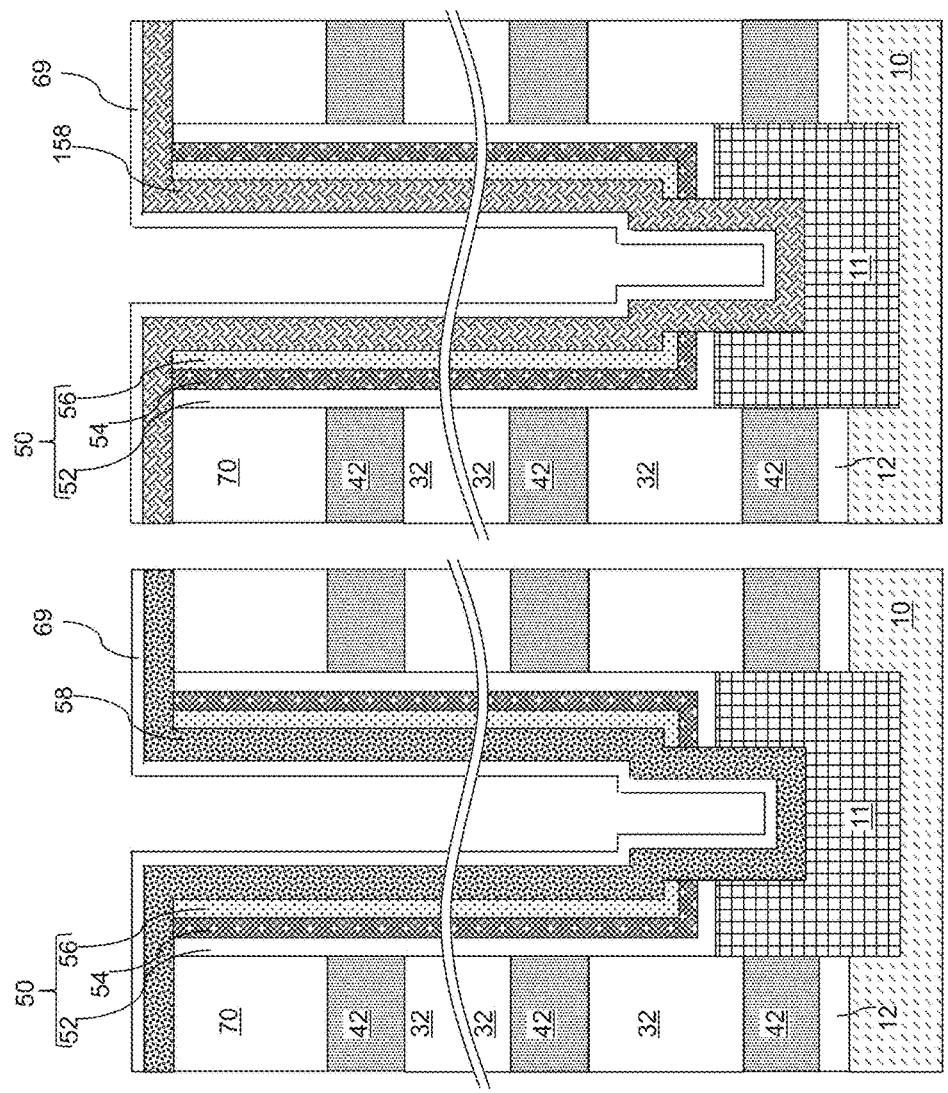

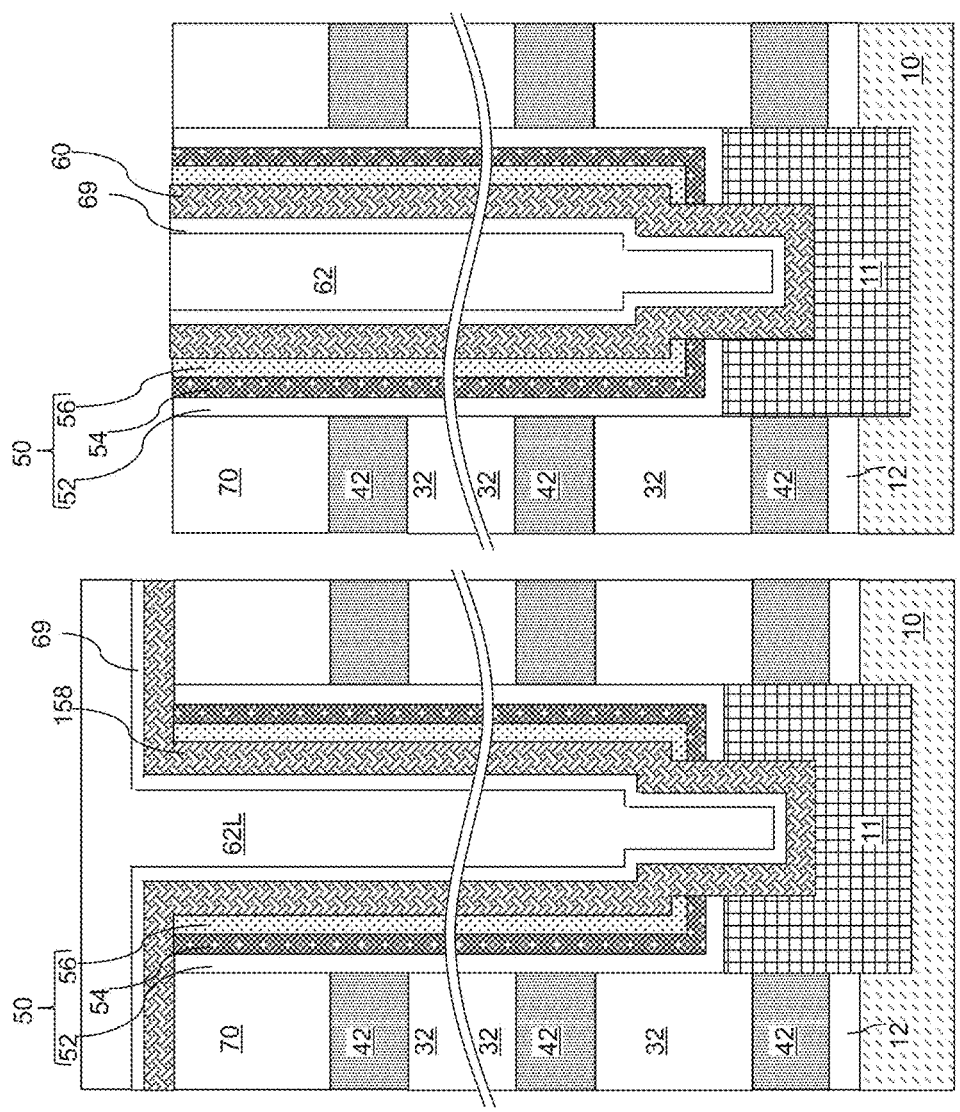

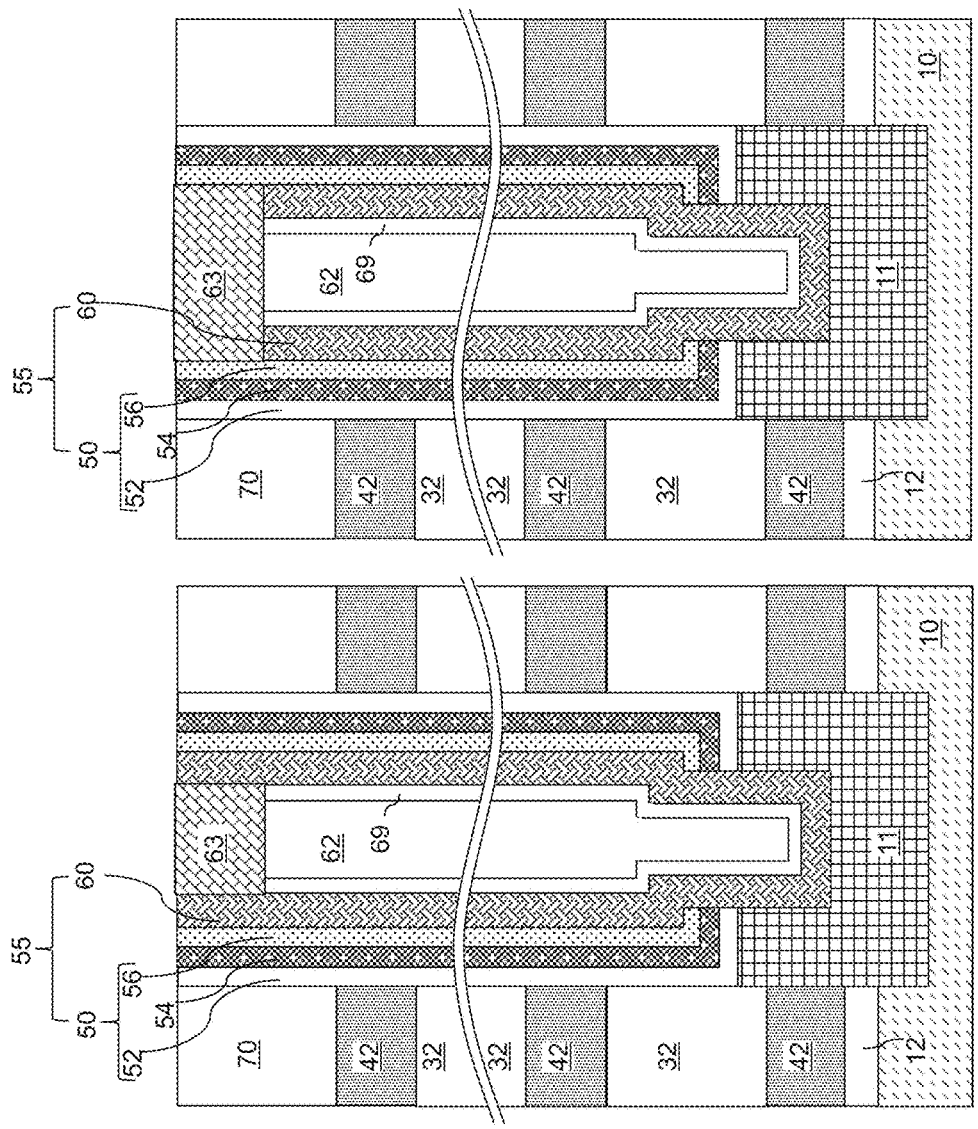

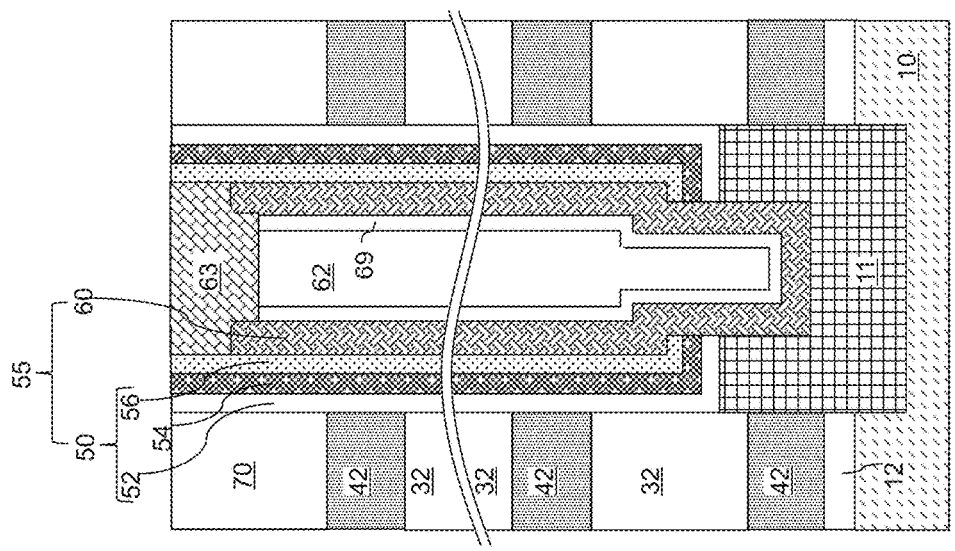
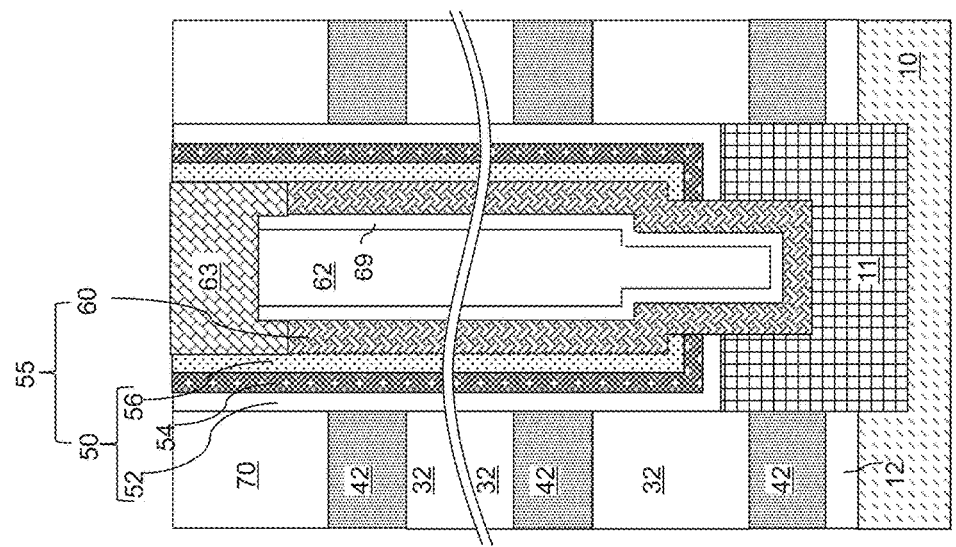
FIG. 5M
FIG. 5N

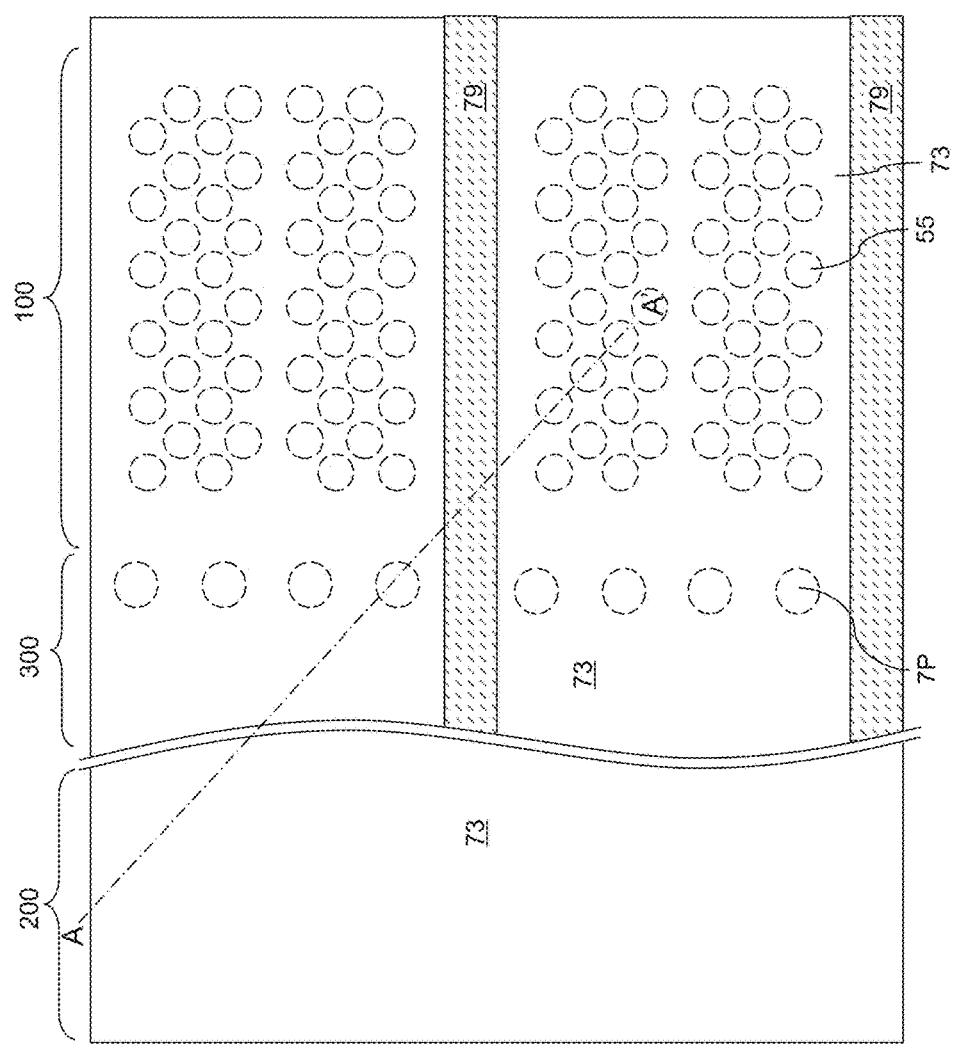

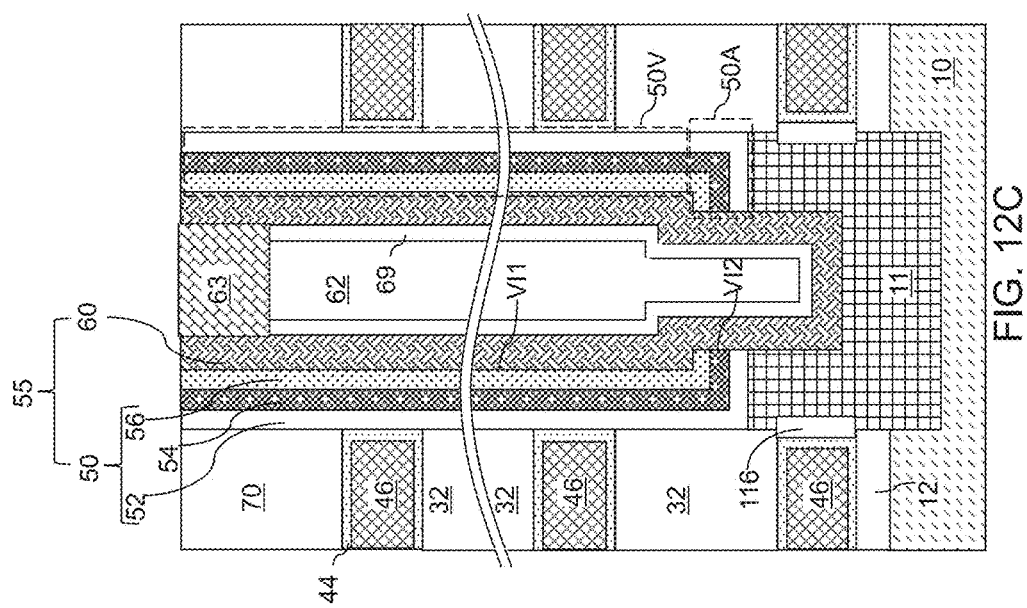

THREE-DIMENSIONAL MEMORY DEVICE HAVING EPITAXIAL GERMANIUM-CONTAINING VERTICAL CHANNEL AND METHOD OF MAKING THEREOF

FIELD

The present disclosure relates generally to the field of semiconductor devices, and particular to a three-dimensional memory device employing a germanium-containing semiconductor channel and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

Mobility of minority charge carriers in the vertical channel of a three-dimensional memory device can limit the current through a vertical field effect transistor, and can adversely impact the operational speed of the three-dimensional memory device. Scattering at grain boundaries of a polycrystalline semiconductor material within the vertical channel is a significant factor that reduces the charge carrier mobility.

SUMMARY

According to an aspect of the present disclosure, a three-dimensional memory device is provided, which comprises: an alternating stack of insulating layers and electrically conductive layers located over a semiconductor substrate; a memory opening extending through the alternating stack to a top surface of the semiconductor substrate; a germanium-containing epitaxial channel layer in epitaxial alignment with a single crystalline structure of the semiconductor substrate; and a memory film located on the germanium-containing epitaxial channel layer and in the memory opening.

According to another aspect of the present disclosure, a method of forming a three-dimensional memory device is provided. An alternating stack of insulating layers and spacer material layers is formed over a semiconductor substrate. The spacer material layers are formed as, or are replaced with, electrically conductive layers. A memory opening extending through the alternating stack to a top surface of the semiconductor substrate is formed. A memory film is formed in the memory opening. A germanium-containing semiconductor layer is formed on the memory film. The germanium-containing semiconductor layer is converted into a germanium-containing epitaxial channel layer that is in epitaxial alignment with a single crystalline structure of the semiconductor substrate.

BRIEF DESCRIPTION OF THE DRAWINGS

FIG. 1 is a schematic vertical cross-sectional view of an exemplary structure after formation of at least one peripheral device, a semiconductor material layer, and a gate dielectric layer according to an embodiment of the present disclosure.

FIG. 2 is a schematic vertical cross-sectional view of the exemplary structure after formation of an alternating stack of insulating layers and sacrificial material layers according to an embodiment of the present disclosure.

FIG. 3 is a schematic vertical cross-sectional view of the exemplary structure after formation of stepped terraces and a retro-stepped dielectric material portion according to an embodiment of the present disclosure.

FIGS. 5A-5K are sequential schematic vertical cross-sectional views of a memory opening within the exemplary structure during various processing steps employed to form a memory stack structure according to an embodiment of the present disclosure.

FIGS. 5L-5N are vertical cross-sectional views of alternative embodiments of memory stack structures according to various embodiments of the present disclosure.

FIG. 7B is a partial see-through top-down view of the exemplary structure of FIG. 7A. The vertical plane A-A' is the plane of the schematic vertical cross-sectional view of FIG. 7A.

FIG. 12C is a magnified view of a memory opening of the exemplary structure of FIG. 12A.

DETAILED DESCRIPTION

Figure 4A:
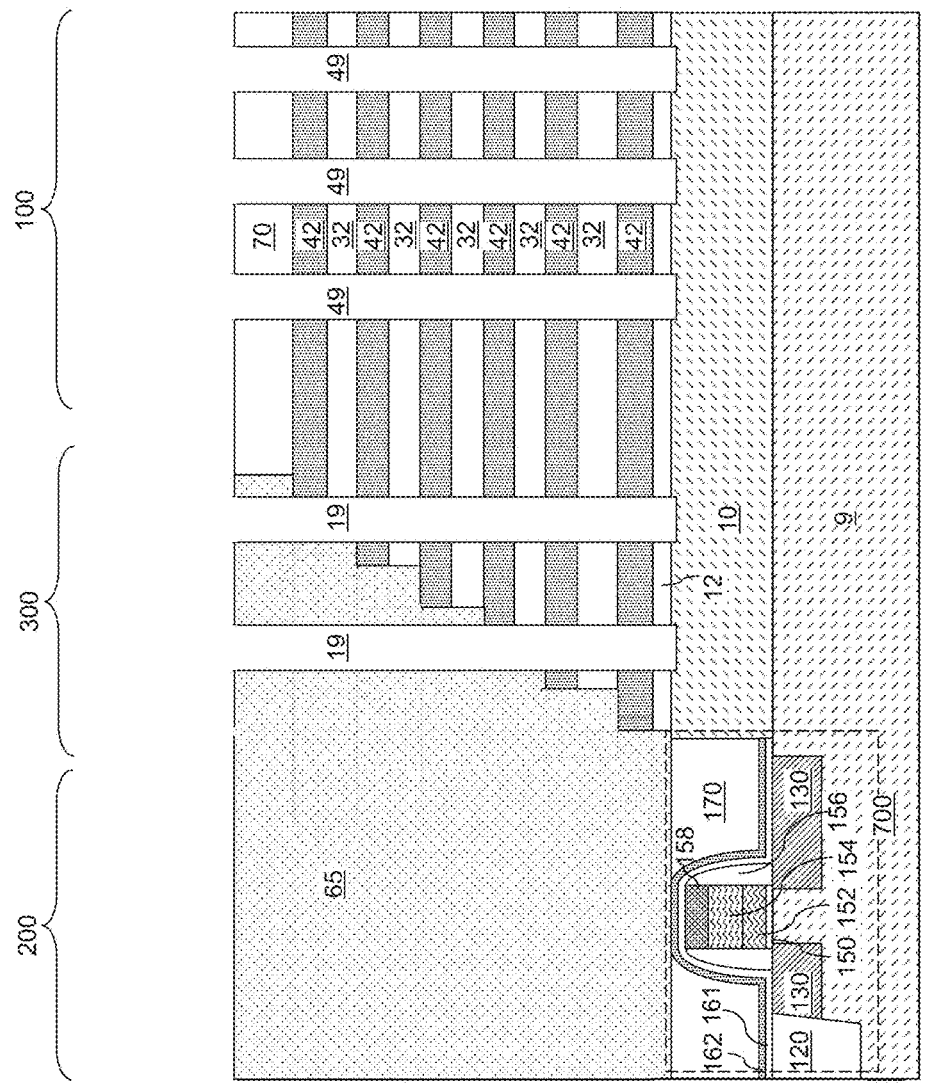
FIG. 4A is a schematic vertical cross-sectional view of the exemplary structure after formation of memory openings according to an embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric 158. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Optionally, a gate dielectric layer 12 can be formed above the semiconductor material layer 10 and the planarization dielectric layer 170. The gate dielectric layer 12 can be, for example, silicon oxide layer. The thickness of the gate dielectric layer 12 can be in a range from 3 nm to 30 nm, although lesser and greater thicknesses can also be employed.

Referring to FIG. 2, a stack of an alternating plurality of first material layers (which can be insulating layers 32) and second material layers (which can be sacrificial material layer 42) is formed over the top surface of the substrate, which can be, for example, on the top surface of the gate dielectric layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Referring to FIG. 3, a stepped cavity can be formed within the contact region 300 which is located between the device region 100 and the peripheral region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4B:
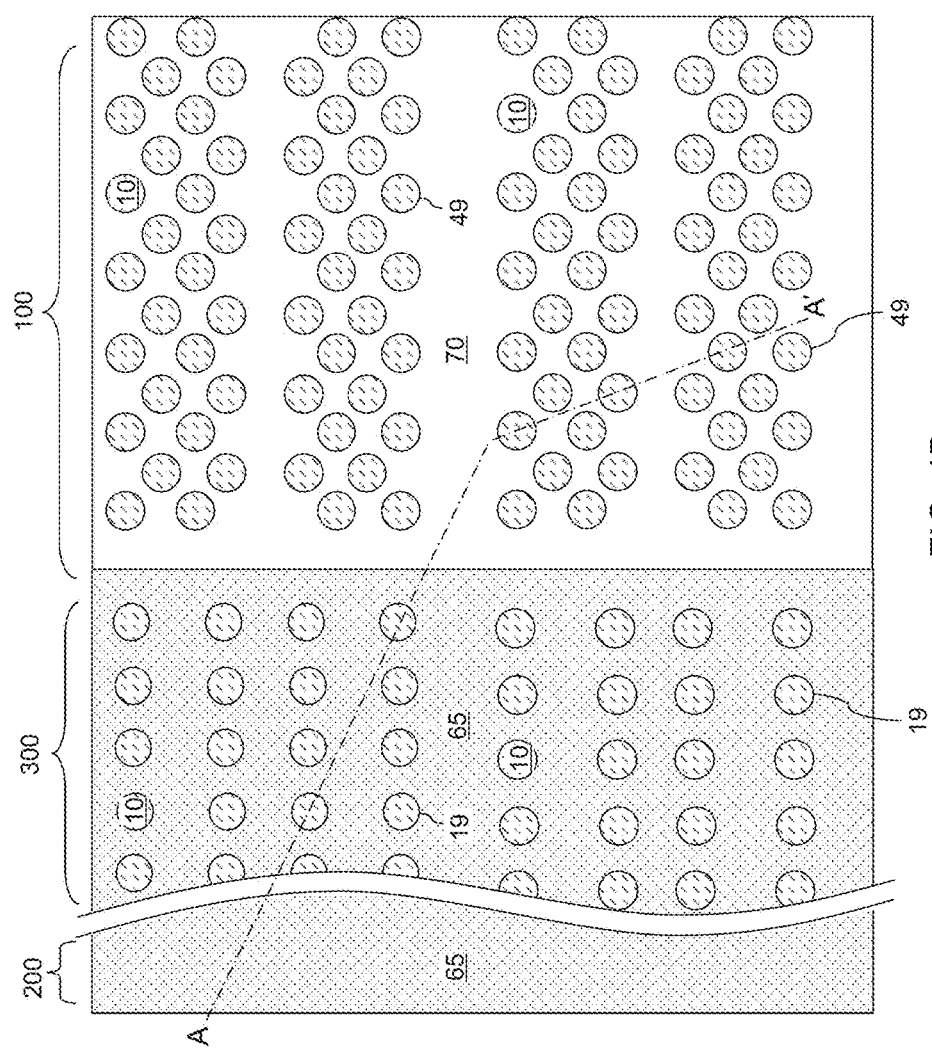
FIG. 4B is a top-down view of the exemplary structure of FIG. 4A. The vertical plane A-A' is the plane of the schematic vertical cross-sectional view of FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure that mechanically supports other elements, such as a support pillar structure, is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The transfer of the pattern in the patterned lithographic material stack through the alternating stack (32, 42) forms the memory openings 49 that extend through the entirety of the alternating stack (32, 42), and the support openings 19 that extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can be formed through the gate dielectric layer 12 so that the memory openings 49 and the support openings 19 extend from the top surface of the alternating stack (32, 42) to at least the top surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10. Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5K illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIG. 4 is illustrated. The memory opening 49 extends through the insulating cap layer 70, the alternating stack (32, 42), the gate dielectric layer 12, and optionally into an upper portion of the semiconductor material layer 10. At this processing step, each support opening 19 can extend through the retro-stepped dielectric material portion 65, a subset of layers in the alternating stack (32, 42), the gate dielectric layer 12, and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional silicon-containing epitaxial pedestal 11 can be formed at the bottom portion of each memory opening 49 and each support opening 19, for example, by selective epitaxy. Each silicon-containing epitaxial pedestal 11 comprises a silicon-containing single crystalline semiconductor material in epitaxial alignment with the single crystalline semiconductor material of the semiconductor material layer 10. Thus, each silicon-containing epitaxial pedestal 11 can be in epitaxial alignment with the semiconductor substrate (9, 10).

In one embodiment, the silicon-containing epitaxial pedestal 11 can include single crystalline silicon or a single crystalline silicon-germanium alloy including silicon at an atomic concentration greater than 50%, such as between 80% and 99%. In one embodiment, the silicon-containing epitaxial pedestal 11 can be doped with electrical dopants of the same conductivity type as the semiconductor material layer 10. In case the silicon-containing epitaxial portion 11 includes electrically doped single crystalline silicon, the silicon-containing epitaxial pedestal 11 can include silicon at an atomic concentration greater than 98%, and the balance of the atomic percentage can be due to electrical dopants, which can be p-type dopants or n-type dopants.

In one embodiment, the top surface of each silicon-containing epitaxial pedestal 11 can be formed above a horizontal plane including the top surface of a sacrificial material layer 42. In this case, at least one source select gate electrode can be subsequently formed by replacing each sacrificial material layer 42 located below the horizontal plane including the top surfaces of the silicon-containing epitaxial pedestals 11 with a respective conductive material layer. The silicon-containing epitaxial pedestal 11 can be a portion of a transistor channel that extends between a source region to be subsequently formed in the substrate (9, 10) and a drain region to be subsequently formed in an upper portion of the memory opening 49.

A cavity 49' is present in the unfilled portion of each memory opening 49 (or of each support opening 19) above the silicon-containing epitaxial pedestal 11. In one embodiment, the silicon-containing epitaxial pedestal 11 can consist of a p-doped or n-doped single crystalline silicon. In one embodiment, the silicon-containing epitaxial pedestal 11 can have a doping of the first conductivity type, which is the same as the conductivity type of the semiconductor material layer 10 that the silicon-containing epitaxial pedestal contacts. If a semiconductor material layer 10 is not present, the silicon-containing epitaxial pedestal 11 can be formed directly on the substrate semiconductor layer 9, which can have a doping of the first conductivity type.

Figures 5C, 5D:
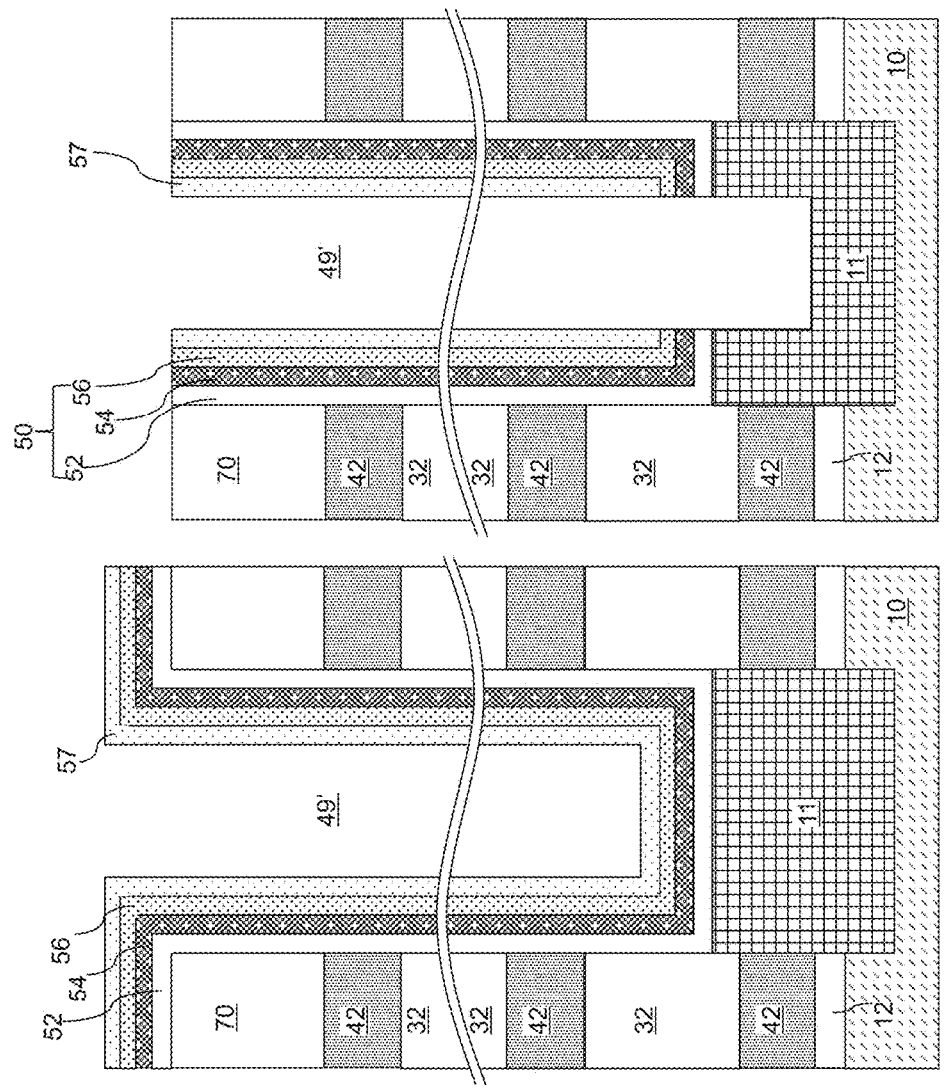

Referring to FIG. 5C, a stack of layers including a blocking dielectric layer 52, a charge storage layer 54, a tunneling dielectric layer 56, and an optional cover material layer 57 can be sequentially deposited in each of the memory openings 49 and the support openings 19.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional cover material layer 57 includes a protective material that can cover and protect the tunneling dielectric layer 56 during a subsequent anisotropic etch process. The cover material layer 57 can include a semiconductor material (such as amorphous silicon or polysilicon), or a dielectric material that is different from the material of the tunneling dielectric layer 56 and that has etching selectivity to the tunneling dielectric layer 56 (such as amorphous carbon, organosilicate glass, or a silicon-containing polymer). The cover material layer 57 can be formed by a conformal deposition method such as low pressure chemical vapor deposition (LPCVD). The thickness of the cover material layer 57 can be in a range from 2 nm to 10 nm, although lesser and greater thicknesses can also be employed. A cavity 49' is formed in the volume of each memory opening 49 that is not filled with the deposited material layers (52, 54, 56, 57).

Referring to FIG. 5D, the optional cover material layer 57, the tunneling dielectric layer 56, the charge storage layer 54, the blocking dielectric layer 52 are sequentially anisotropically etched employing at least one anisotropic etch process. The portions of the cover material layer 57, the tunneling dielectric layer 56, the charge storage layer 54, and the blocking dielectric layer 52 located above the top surface of the insulating cap layer 70 can be removed by the at least one anisotropic etch process. Further, the horizontal portions of the cover material layer 57, the tunneling dielectric layer 56, the charge storage layer 54, and the blocking dielectric layer 52 at a bottom of each cavity 49' can be removed to form openings in remaining portions thereof. Each of the cover material layer 57, the tunneling dielectric layer 56, the charge storage layer 54, and the blocking dielectric layer 52 can be etched by anisotropic etch process.

The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge trapping layer in which each portion adjacent to the sacrificial material layers 42 constitutes a charge storage region.

A surface of the silicon-containing epitaxial pedestal 11 (or a surface of the semiconductor substrate layer 10 in case the silicon-containing epitaxial pedestals 11 are not employed) can be physically exposed underneath each of the memory openings 49 and the support openings 19 through the cover material layer 57, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the silicon-containing epitaxial pedestal 11 (or of the semiconductor substrate layer 10 in case silicon-containing epitaxial pedestals 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. Each memory film 50 can be formed directly on a top surface of a respective silicon-containing epitaxial pedestal 11. In one embodiment, the cover material layer 57, the tunneling dielectric layer 56, the charge storage layer 54, and the blocking dielectric layer 52 can have vertically coincident sidewalls.

Referring to FIG. 5E, the cover material layer 57 can be removed selective to the memory film 50. An isotropic etch, such as a wet etch or chemical dry etching, can be employed to remove the cover material layer 57 from each of the memory openings 49 and the support openings 19. A cavity 49' is present within each memory opening 49 and the support opening 19. In an alternative embodiment, if the cover material layer 57 comprises a semiconductor material layer, such as polysilicon or amorphous silicon, then it can be retained in the final device instead of being removed at this point. The device in which the cover material layer 57 is retained is shown in FIG. 12D and is described below.

Referring to FIG. 5F, a germanium-containing semiconductor layer 58 can be deposited in each of the memory openings 49 and the support openings 19. The germanium-containing semiconductor layer 58 includes germanium or a silicon-germanium alloy including germanium at an atomic concentration greater than 10%. The germanium-containing semiconductor layer 58 may consist essentially of germanium or the silicon-germanium alloy, or may include p-type electrical dopants or n-type electrical dopants at an atomic concentration less than 0.01%. If the silicon-containing epitaxial pedestals 11 include germanium, the atomic concentration of germanium in the germanium-containing semiconductor layer 58 can be greater than the atomic concentration of germanium in the silicon-containing epitaxial pedestals 11.

The germanium-containing semiconductor layer 58 can be formed directly on an inner sidewall of each memory film 50. Specifically, the germanium-containing semiconductor layer 58 can be formed directly on the inner sidewall of the tunneling dielectric layers 56 after removal of the cover material layers 57 within each of the memory openings 49 and the support openings 19. The germanium-containing semiconductor layer 58 can be deposited directly on the semiconductor surface of each silicon-containing epitaxial pedestal 11 (or directly on the semiconductor substrate layer 10 if the silicon-containing epitaxial pedestal 11 are omitted), and directly on each tunneling dielectric layer 56.

In one embodiment, the germanium-containing semiconductor layer 58 can be formed as a continuous amorphous germanium or silicon-germanium layer having a uniform thickness throughout. Alternatively, layer 58 may be a polycrystalline germanium or silicon-germanium layer. The germanium-containing semiconductor layer 58 can be formed by a conformal deposition method such as low pressure chemical vapor deposition (LPCVD). The thickness of the germanium-containing semiconductor layer 58 can be in a range from 3 nm to 30 nm, although lesser and greater thicknesses can also be employed. The germanium-containing semiconductor layer 58 may partially fill the cavity 49' in each of the memory openings 49 and the support openings 19.

Referring to FIG. 5G, a dielectric layer 69 can be formed on the physically exposed surfaces of the germanium-containing semiconductor layer 58, which include the inner sidewalls of the germanium-containing semiconductor layer 58 within each memory opening 49 and each support opening 19. The dielectric layer 69 can include a dielectric oxide material that can provide sufficient mechanical strength without deformation, and does not react with the material of the germanium-containing semiconductor layer, at the melting point of the material of the germanium-containing semiconductor layer 58. For example, the dielectric layer 69 can include a material having a greater reflow temperature or melting temperature than the material of the germanium-containing semiconductor layer 58. For example, the dielectric layer 69 can include silicon oxide or aluminum oxide. Alternatively, the dielectric layer 69 can include a non-oxide dielectric material, such as a nitride dielectric material, for example silicon nitride or silicon oxynitride. The dielectric layer 69 can be deposited by a conformal deposition process such as chemical vapor deposition or atomic layer deposition. The thickness of the dielectric layer 69 can be in a range from 2 nm to 30 nm, although lesser and greater thicknesses can also be employed.

Figure 13:
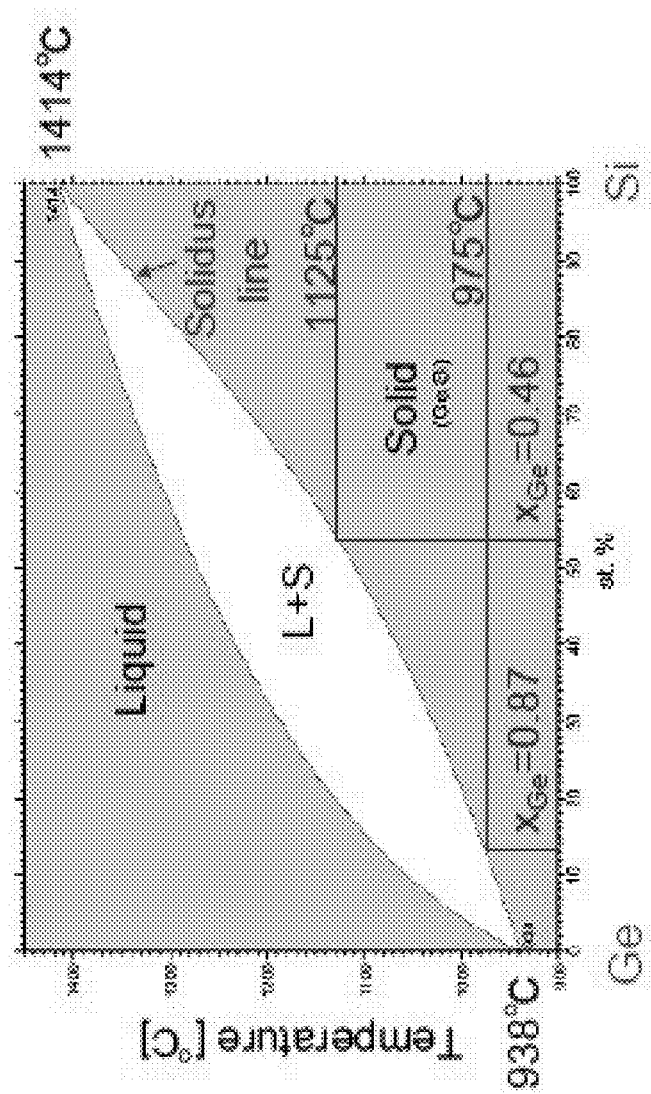
FIG. 13 shows a prior art phase diagram of a silicon-germanium alloy system.

Referring to FIG. 5H, the germanium-containing semiconductor layer 58 can be converted into a germanium-containing epitaxial channel layer 158 (i.e., a single crystalline germanium containing semiconductor layer) by liquid phase epitaxy. The liquid phase epitaxy can be performed employing an anneal process. During the anneal process, the temperature of the material of the germanium-containing layer 58 can be raised above the melting point of the material of the germanium-containing semiconductor layer 58 and below the melting temperature of the silicon-containing epitaxial pedestal 11. Thus, the material of the germanium-containing semiconductor layer 58 is melted, and is transformed into a liquid phase during the anneal. In one embodiment, the temperature of the material of the germanium-containing semiconductor layer 58 can be raised to a reflow temperature, which can be a temperature between the melting point of the germanium-containing semiconductor layer 58 and a temperature which is below the melting point of the silicon-containing epitaxial pedestal 11. For example, the reflow temperature can be in a range from the melting point of the germanium-containing semiconductor layer 58 and a temperature that is 5 degrees, 3 degrees, or 2 degree above the melting point of the germanium-containing semiconductor layer 58. In case the germanium-containing semiconductor layer 58 consists of pure germanium (including p-type and/or n-type dopant atoms and unavoidable impurities), the melting point can be about 938 degrees Celsius. Thus, the anneal may be conducted at a temperature above 938 degrees Celsius, such as 939 to 948 degrees Celsius. If the germanium-containing semiconductor layer 58 includes a silicon-germanium alloy, the melting point can be between 938 degrees and 1,428 degrees Celsius. In case the germanium-containing semiconductor layer 58 includes electrical dopants at an atomic concentration less than 0.01%, the shift of the melting temperature of the germanium-containing semiconductor layer 58 due to the electrical dopants may be negligible. FIG. 13 shows the phase diagram of a silicon-germanium alloy system. For example, the melting point of a silicon-germanium compound semiconductor material having 87 atomic percent germanium is about 975 degrees Celsius, while the melting point of a silicon-germanium compound semiconductor material having 46 atomic percent germanium is about 1125 degrees Celsius.

Referring back to FIG. 5H, during cooling of the material of the germanium-containing semiconductor layer 58 after reaching the reflow temperature, the material of the germanium-containing semiconductor layer 58 can crystallize on the surfaces of the silicon-containing epitaxial pedestals 11 within each memory opening 49 and within each support opening 19. Liquid phase epitaxy can grow a single crystalline semiconductor material portion on a single crystalline semiconductor matrix portion, which is the silicon-containing epitaxial pedestal 11 (or the semiconductor material layer 10 if pedestal 11 is omitted) within each of the memory openings 49 and the support openings 19 in this case. Liquid phase epitaxy employs near-equilibrium conditions between dissolution and deposition of the single crystalline semiconductor material. Liquid phase epitaxy occurs at temperatures near, and above, the melting point of the material of the germanium-containing semiconductor layer 58. The material of the germanium-containing semiconductor layer 58 re-crystallizes in epitaxial alignment with the single crystalline structure of the underlying silicon-containing epitaxial pedestal 11 to form a single crystalline germanium-containing epitaxial channel layer 158, such as a single crystalline germanium or silicon-germanium layer. The rate of crystal growth and the concentration of crystalline defects can be controlled through temperature control during the liquid phase epitaxy process, e.g., the cooling rate during the liquid phase epitaxy process.

The single crystalline silicon-containing material (which may be silicon or a silicon-germanium alloy with a lower germanium concentration than the germanium-containing epitaxial channel layer 158) of the pedestal 11 and/or substrate (9, 10) can be employed as the template to which the epitaxial structure of the germanium-containing epitaxial channel layer 158 is registered to. Thus, the semiconductor substrate (9, 10), the silicon-containing epitaxial pedestal 11, and the germanium-containing epitaxial channel layer 158 are epitaxially aligned to one another. In one embodiment, threading dislocations can be terminated around a bottom region of the germanium-containing epitaxial channel layer 158 so that mobility of charge carriers is not affected at the levels of sacrificial material layers 42, which care levels of memory elements of the three-dimensional memory device of the exemplary structure. In one embodiment the germanium-containing epitaxial channel layer 158 may be under compressive stress, which is believed to increase the charge carrier mobility in the layer 158. Without wishing to be bound by a particular theory, it is believed that compressive strain splits the degenerate valence bands of germanium or a silicon-germanium alloy into a light hole band and a heavy hole band. As a result, the hole mobility of biaxial compressively strained Ge channel can be higher than that of bulk germanium or bulk silicon. In another embodiment, the germanium-containing epitaxial channel layer 158 may be unstrained such that no compressive stress is applied to the layer 158.

Within each of the memory openings 49 and the support openings 19, the liquid phase epitaxy can be performed while the material of the germanium-containing semiconductor layer 58 is physically confined between the memory film 50 and the dielectric layer 69. Thus, the memory film 50 and the dielectric layer 69 within each of the memory openings 49 and the support openings 19 provide crucible structures that physically confine the material of the germanium-containing semiconductor layer 58 during the liquid phase epitaxy process. Each germanium-containing epitaxial channel layer 158, which includes the semiconductor material of the germanium-containing semiconductor layer 58 prior to the liquid epitaxy process, can be in epitaxial alignment with the single crystalline structure of the underlying silicon-containing epitaxial pedestal 11. The germanium-containing epitaxial channel layer 158 includes germanium or a silicon-germanium alloy including germanium at an atomic concentration greater than 10%. The germanium-containing epitaxial channel layer 158 may consist essentially of germanium or the silicon-germanium alloy, or may include p-type electrical dopants or n-type electrical dopants at an atomic concentration less than 0.01%. If the silicon-containing epitaxial pedestals 11 include germanium, the atomic concentration of germanium in the germanium-containing epitaxial channel layer 158 can be greater than the atomic concentration of germanium in the silicon-containing epitaxial pedestals 11.

An optional plasma oxidation process (e.g., ECR plasma) can be performed on the dielectric layer 69 to improve the interfaces between the germanium-containing epitaxial channel layer 158 and the dielectric oxide liner 69 and/or the interface between the layer 158 and the tunneling dielectric layer 56. Preferably, the plasma oxidation is carried out at a temperature below 600 degrees Celsius to prevent or decrease germanium oxide desorption. Surface defect density around these interfaces can decrease with plasma oxidation (PO). In this case, supplying enough oxygen atoms can form more stoichiometric $GeO_2$ at the interface(s) of layer 158, such as an interface between layers 158 and 56 and avoid formation of GeO, which is more volatile than $GeO_2$.

Referring to FIG. 5I, in case the cavities in the memory openings 49 and the support openings 19 are not completely filled by the memory film 50, the germanium-containing epitaxial channel layer 158 and the dielectric layer 69, a dielectric core layer 62L can be deposited in the cavities to fill the memory openings 49 and the support openings 19. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5J, the horizontal portion of the dielectric core layer 62L and the dielectric layer 69 can be removed, for example, by a recess etch from above the top surface of the insulating cap layer 70. Each remaining portion of the dielectric core layer 62L constitutes a dielectric core 62. Further, the horizontal portion of the germanium-containing epitaxial channel layer 158 located above the top surface of the insulating cap layer 70 can be removed by a planarization process, which can employ a recess etch or chemical mechanical planarization (CMP). Each remaining portion of the germanium-containing epitaxial channel layer 158 is a portion of a channel through which electrical current can flow when a vertical NAND device including the germanium-containing epitaxial channel layer 158 is turned on. Each dielectric core 62 is formed in a volume laterally surrounded by a respective dielectric layer 69 after formation of the germanium-containing epitaxial channel layers 158.

A tunneling dielectric layer 56 is surrounded by a charge storage layer 54, and laterally surrounds a portion of the germanium-containing epitaxial channel layer 158. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5K, each dielectric core 62 and each dielectric layer 69 can be recessed within each of the memory openings 49 and the support openings 19, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a germanium-containing epitaxial channel layer 158 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a silicon-containing epitaxial pedestals 11 (if present), a memory film 50, a germanium-containing epitaxial channel layer 158, a dielectric layer 69, a dielectric core 62, and a drain region 63 within each support opening 19 fills the respective support openings 19, and constitutes a support pillar structure 20, as shown in FIG. 6.

FIGS. 5L-5N illustrate alternative embodiments of the memory stack structure 55, which can be derived from the memory stack structure 55 illustrated in FIG. 5K by at least partially recessing the germanium-containing epitaxial channel layer 158 and/or converting an end portion of the germanium-containing epitaxial channel layer 158 into a heavily doped semiconductor portion. In this case, the drain region 63 can overlie the top portion of an underlying germanium-containing epitaxial channel layer 158. The interface between the drain region 63 and the germanium-containing epitaxial channel layer 158 can be coplanar with the interface between the drain region 63 and the dielectric core 62 as illustrated in FIG. 5L, may be formed below the interface between the drain region 63 and the dielectric core 62 as illustrated in FIG. 5M, or may be formed above the interface between the drain region 63 and the dielectric core 62 as illustrated in FIG. 5N depending on the degree of recessing or collateral etching of the germanium-containing epitaxial channel layer 158 before, during, or after recessing of the dielectric material of the dielectric core 62.

Figure 6:
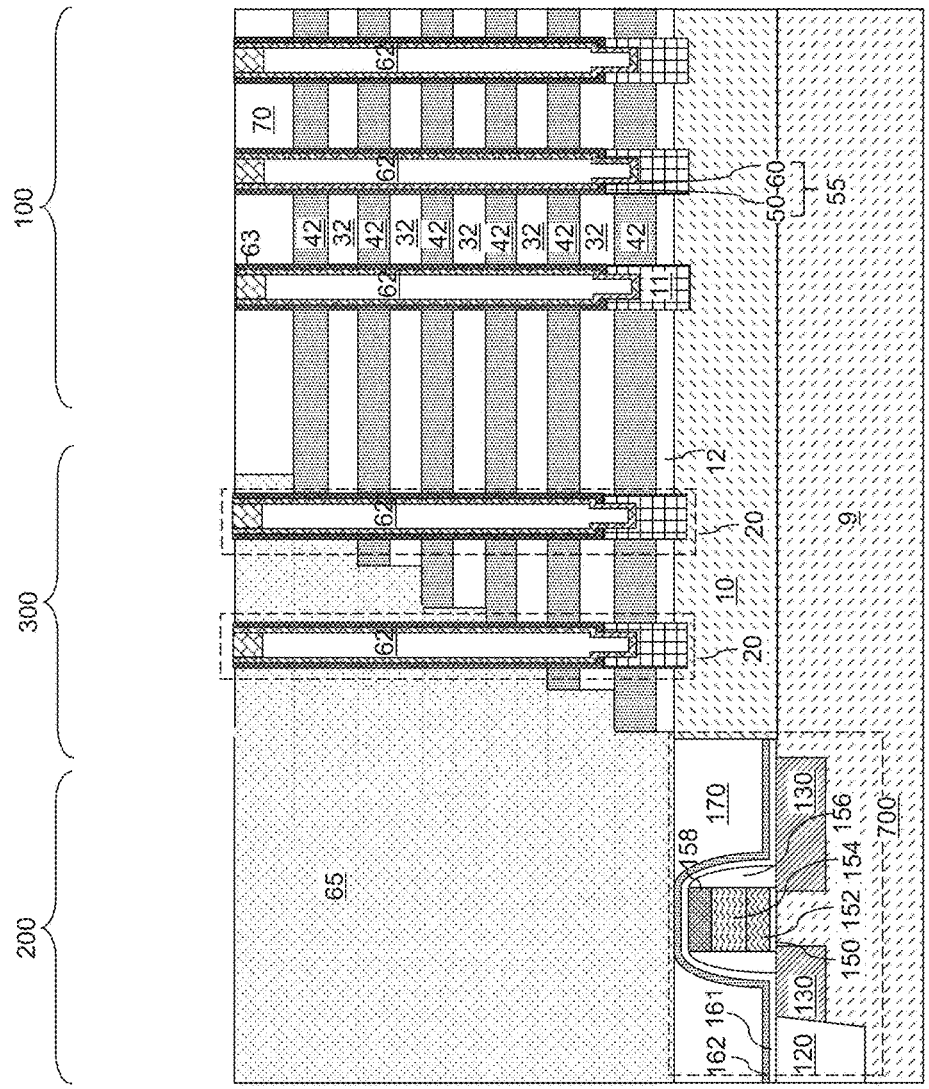
FIG. 6 is a schematic vertical cross-sectional view of the exemplary structure after formation of memory stack structures according to an embodiment of the present disclosure.

Referring to FIG. 6, the exemplary structure is illustrated after formation of memory opening fill structures (11, 55, 69, 62, 63) and support pillar structure 20 within the memory openings 49 and the support openings 19, respectively. Each combination of a silicon-containing epitaxial pedestals 11 (if present), a memory stack structure 55, a dielectric layer 69, a dielectric core 62, and a drain region 63 within a memory opening 49 is herein referred to as a memory opening fill structure (11, 55, 69, 62, 63). An instance of a memory opening fill structure (11, 55, 69, 62, 63) can be formed within each memory opening 49 of the structure of FIGS. 4A and 4B. An instance of the support pillar structure 20 can be formed within each support opening 19 of the structure of FIGS. 4A and 4B.

Figure 7A:
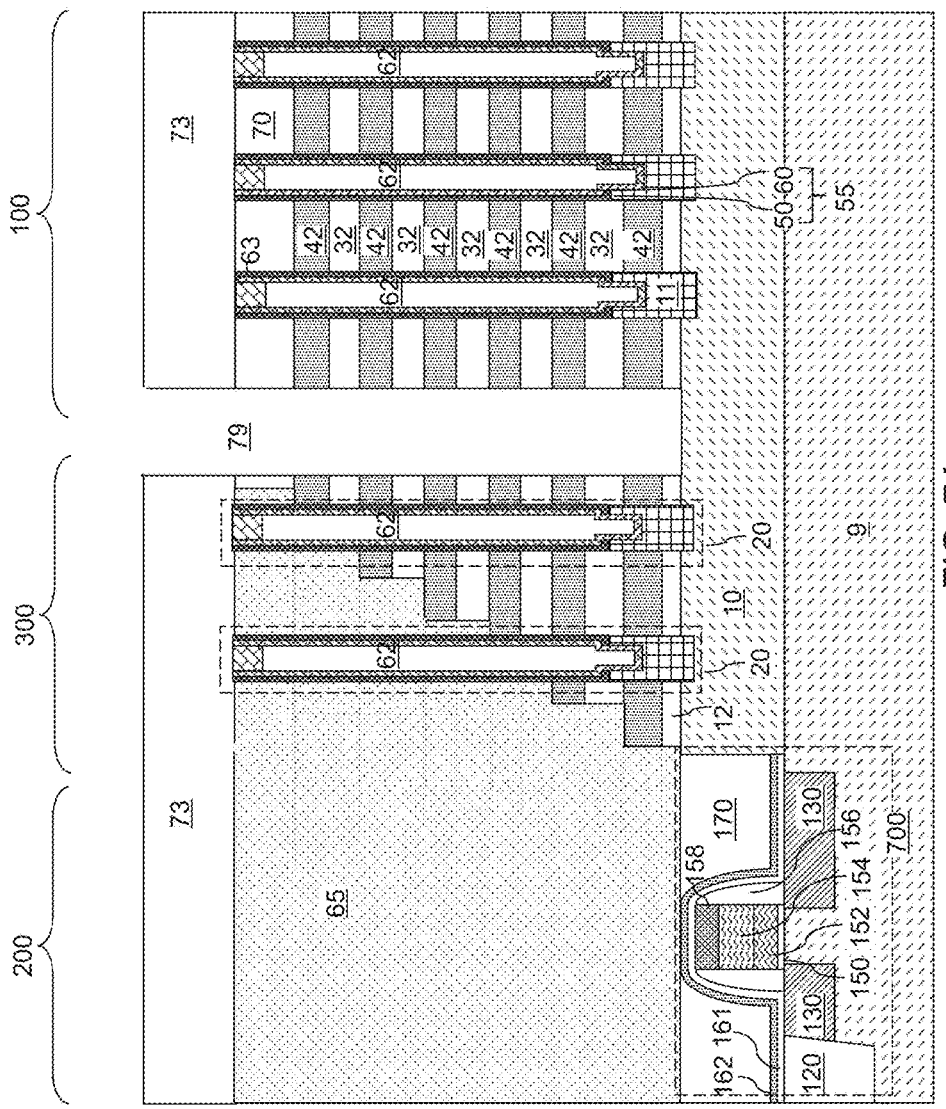
FIG. 7A is a schematic vertical cross-sectional view of the exemplary structure after formation of a backside trench according to an embodiment of the present disclosure.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the alternating stack (32, 42), and is lithographically patterned to form openings in areas between clusters of memory stack structures 55. The pattern in the photoresist layer can be transferred through the alternating stack (32, 42) and/or the retro-stepped dielectric material portion 65 employing an anisotropic etch to form the backside trenches 79, which vertically extend at least to the top surface of the substrate (9, 10), and laterally extend through the memory array region 100 and the contact region 300. In one embodiment, the backside trenches 79 can include a source contact opening in which a source contact via structure can be subsequently formed.

Figure 8:
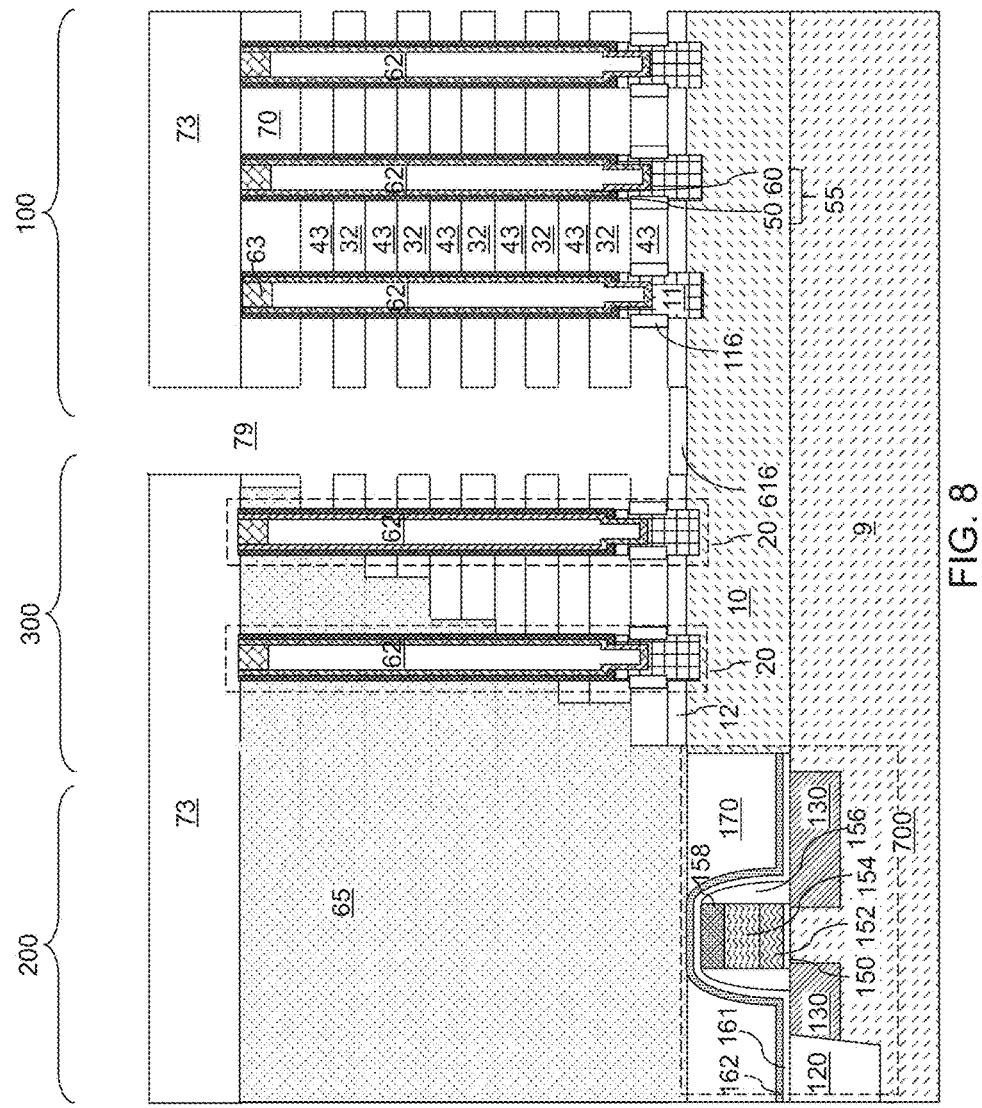
FIG. 8 is a schematic vertical cross-sectional view of the exemplary structure after formation of backside recesses according to an embodiment of the present disclosure.

Referring to FIG. 8, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the outermost blocking dielectric layer 52 located in the memory stack structures 55 and support pillar structures 20, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32 and the retro-stepped dielectric material portion 65 can be selected from silicon oxide, silicon nitride, and dielectric metal oxides. In this case, the depth of the backside trenches 79 can be modified so that the bottommost surface of the backside trenches 79 is located within the gate dielectric layer 12, i.e., to avoid physical exposure of the top surface of the semiconductor material layer 10.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional silicon-containing epitaxial pedestal 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the silicon-containing epitaxial pedestal 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the silicon-containing epitaxial pedestal 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 9:
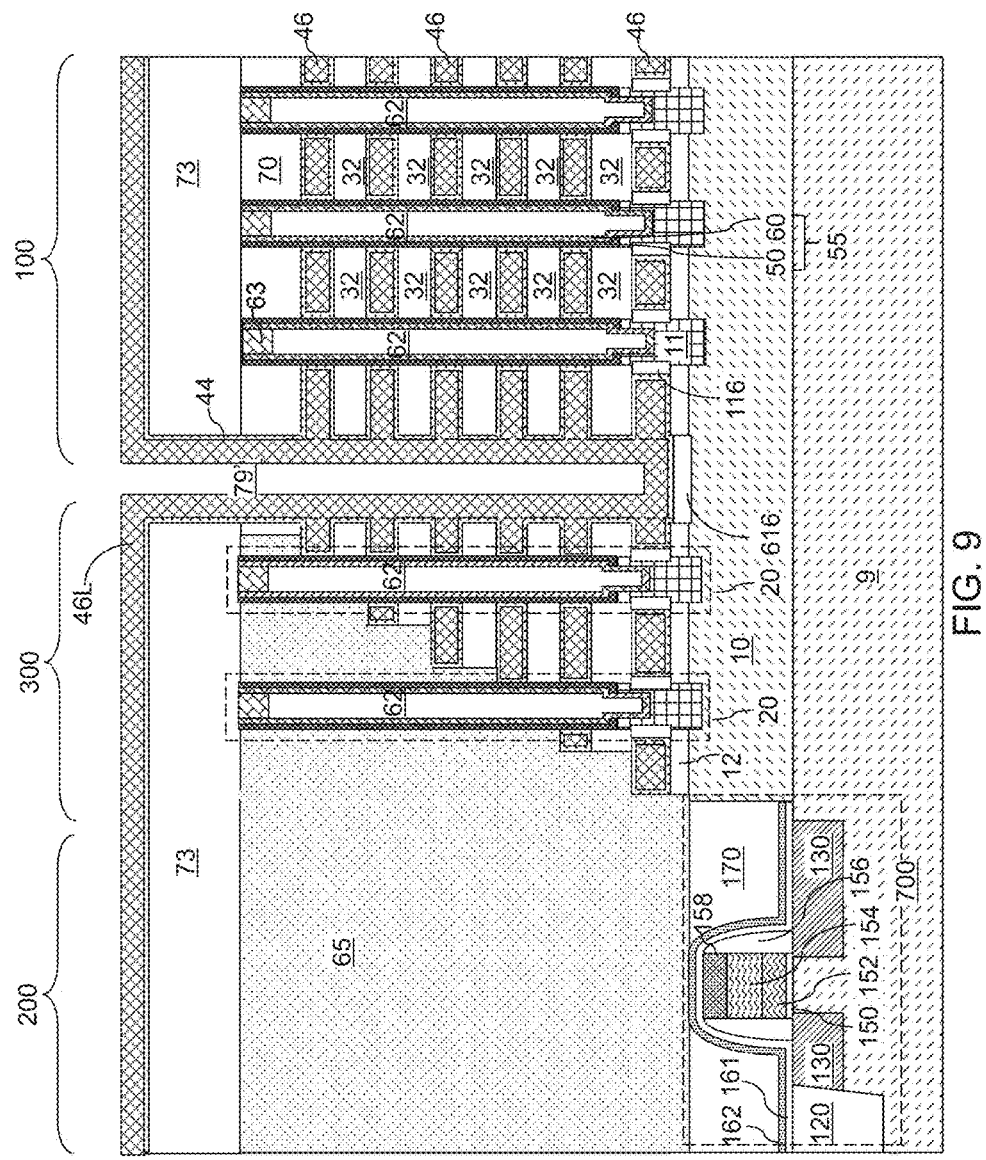
FIG. 9 is a schematic vertical cross-sectional view of the exemplary structure after formation of electrically conductive layers according to an embodiment of the present disclosure.

Referring to FIG. 9, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present.

The backside blocking dielectric layer 44 can be formed in the backside recesses 43 and on a sidewall of the backside trench 79. The backside blocking dielectric layer 43 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. The backside blocking dielectric layer is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer.

At least one metallic material can be deposited in the plurality of backside recesses 43, on the sidewalls of the at least one the backside contact trench 79, and over the top surface of the contact level dielectric layer 73. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material. In one embodiment, the metallic material can be deposited by chemical vapor deposition.

A plurality of electrically conductive layers 46 can be formed in the plurality of backside recesses 43, and a continuous metallic material layer 46L can be formed on the sidewalls of each backside contact trench 79 and over the contact level dielectric layer 73. Thus, each sacrificial material layer 42 can be replaced with an electrically conductive layer 46. A backside cavity 79' is present in the portion of each backside contact trench 79 that is not filled with the backside blocking dielectric layer and the continuous metallic material layer 46L. A tubular dielectric spacer 116 laterally surrounds a semiconductor portion that underlies the lower doped semiconductor portion (e.g., portion 11). A bottommost electrically conductive layer 46 laterally surrounds the tubular dielectric spacer 116 upon formation of the electrically conductive layers 46.

Figure 10:
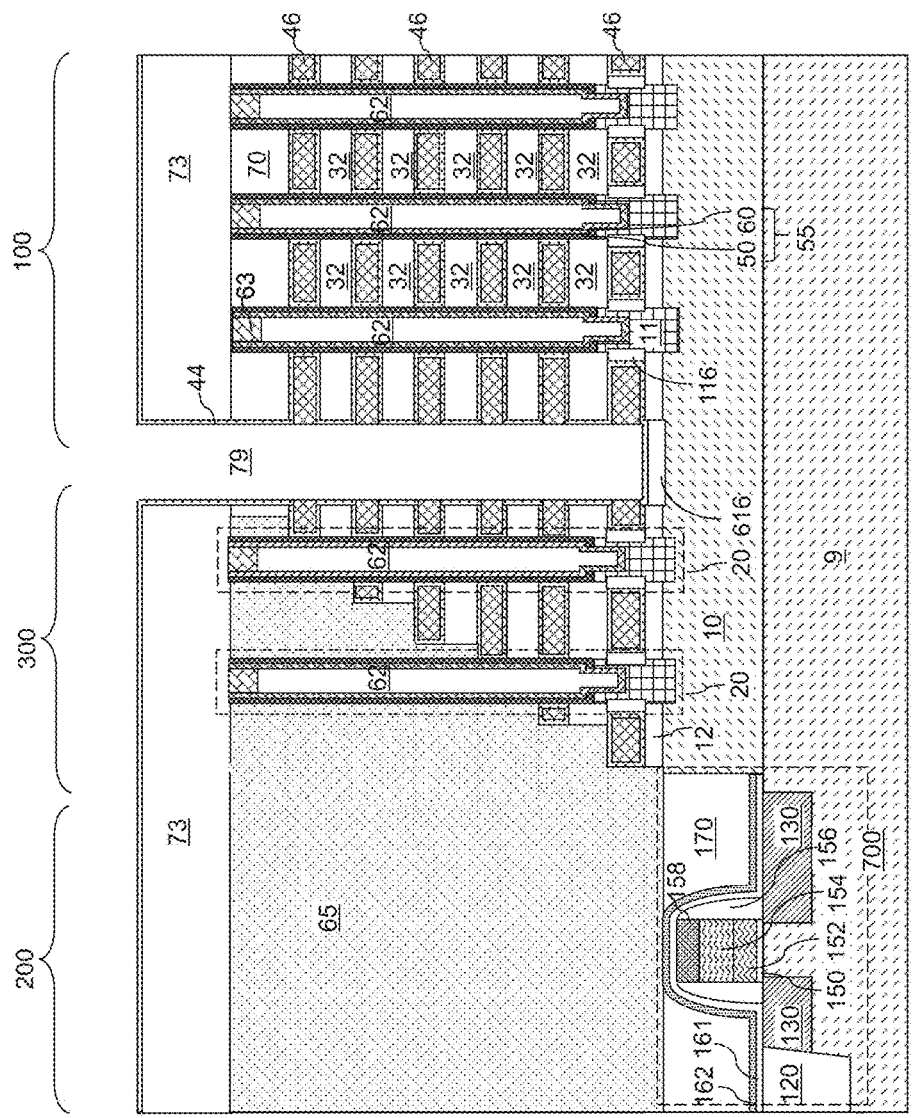
FIG. 10 is a schematic vertical cross-sectional view of the exemplary structure after removal of a deposited conductive material from within the backside trench according to an embodiment of the present disclosure.

Referring to FIG. 10, the deposited metallic material of the continuous electrically conductive material layer 46L is etched back from the sidewalls of each backside contact trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside contact trench 79. The gate dielectric layer 12 can be vertically spaced from the backside contact trench 79 by the horizontal portion of the backside blocking dielectric layer 44.

In another embodiment, the removal of the continuous electrically conductive material layer 46L may not be selective to the material of the backside blocking dielectric layer 44 or, the backside blocking dielectric layer 44 may not be employed. In this case, a top surface and/or sidewall surface, of the gate dielectric layer 12 can be physically exposed at the bottom of the backside contact trench 79 depending on whether the gate dielectric layer 12 is not removed or partially removed during removal of the continuous electrically conductive material layer 46L. In one embodiment, a top surface of the cap gate dielectric layer 126 can be physically exposed at the bottom of the backside contact trench 79 after removal of the continuous electrically conductive material layer 46L. A backside cavity 79' is present within each backside contact trench 79.

Figure 11:
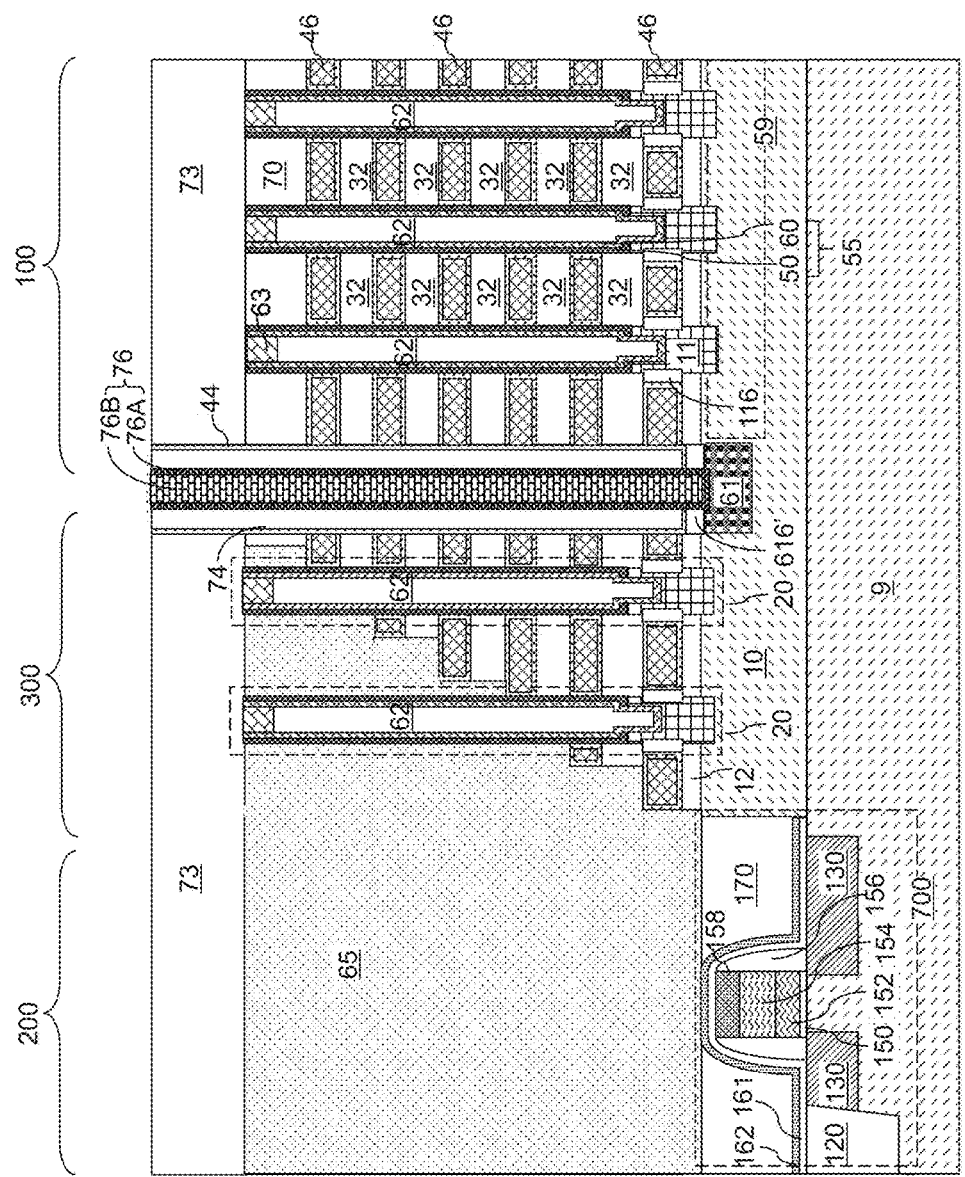
FIG. 11 is a schematic vertical cross-sectional view of the exemplary structure after formation of an insulating spacer and a backside contact structure according to an embodiment of the present disclosure.

Referring to FIG. 11, an insulating material layer can be formed in the at least one backside contact trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46. An anisotropic etch is performed to remove horizontal portions of the insulating material layer from above the contact level dielectric layer 73 and at the bottom of each backside contact trench 79. Each remaining portion of the insulating material layer constitutes an insulating spacer 74. A backside cavity 79' is present within a volume surrounded by each insulating spacer 74.

The anisotropic etch process can continue with, or without, a change in the etch chemistry to remove portions of the optional backside blocking dielectric layer 44 and the planar dielectric portion 616 that underlies the opening through the insulating spacer 74. An opening is formed though the planar dielectric portion 616 underneath each backside cavity 79', thereby vertically extending the backside cavity 79'. A top surface of the semiconductor material layer 10 can be physically exposed at the bottom of each backside contact trench 79. The remaining portion of each planar dielectric portion 616 is herein referred to as an annular dielectric portion 616', which can include a dielectric oxide of the semiconductor material of the semiconductor material layer 10, have a uniform thickness, and an opening therethrough.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of epitaxial channel portions 11 constitutes a horizontal semiconductor channel 59 for a plurality of field effect transistors. The horizontal semiconductor channel 59 is connected to multiple vertical semiconductor channels 60, each of which contains a germanium-containing semiconductor layer 158, through respective epitaxial channel portions 11. The horizontal semiconductor channel 59 contacts the source region 61 and the plurality of epitaxial channel portions 11. A bottommost electrically conductive layer 46 provided upon formation of the electrically conductive layers 46 within the alternating stack (32, 46) can comprise a select gate electrode for the field effect transistors.

A contact via structure 76 can be formed within each cavity 79'. Each contact via structure 76 can fill a respective cavity 79'. The contact via structures 76 can be formed by depositing at least one conductive material in the remaining unfilled volume (i.e., the backside cavity 79') of the backside contact trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside contact trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 12A:
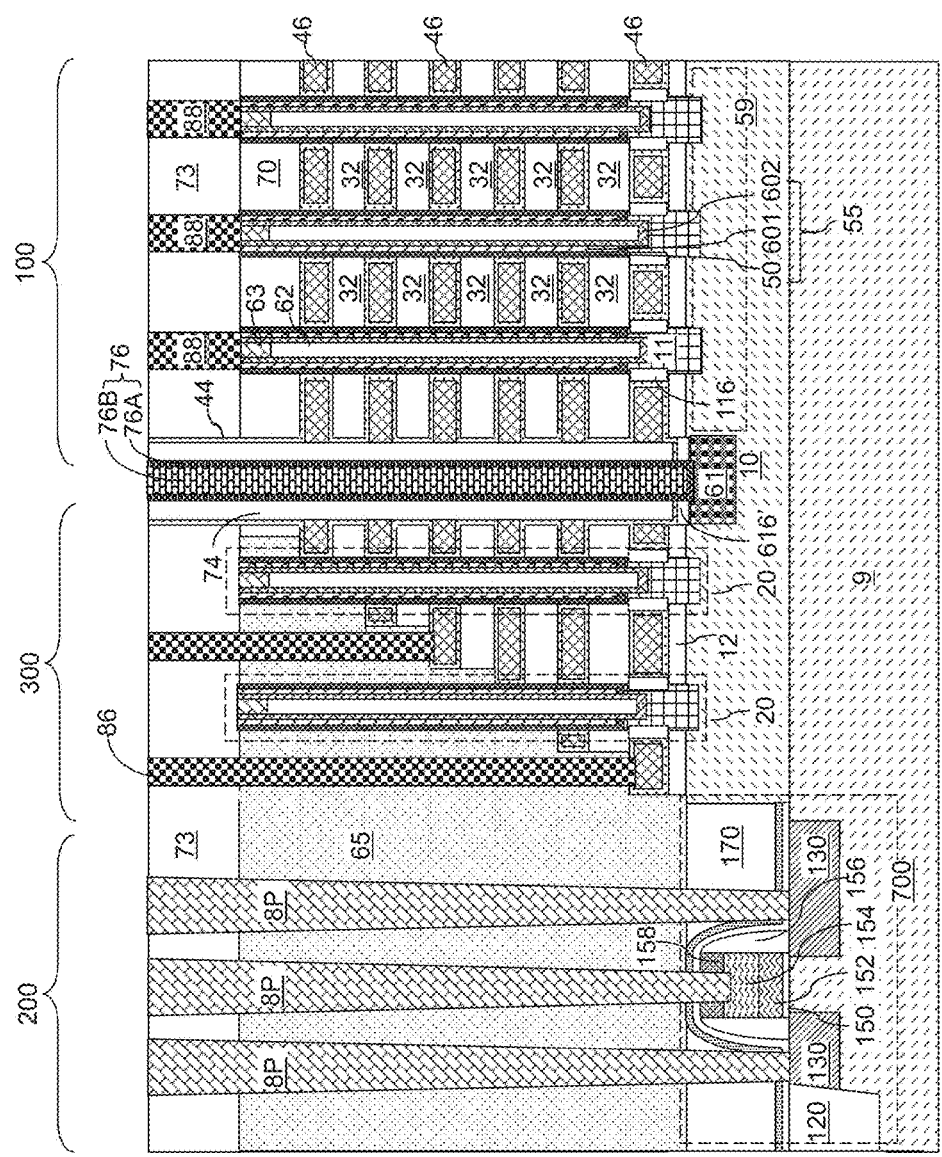
FIG. 12A is a schematic vertical cross-sectional view of the exemplary structure after formation of additional contact via structures according to an embodiment of the present disclosure.
Figure 12B:
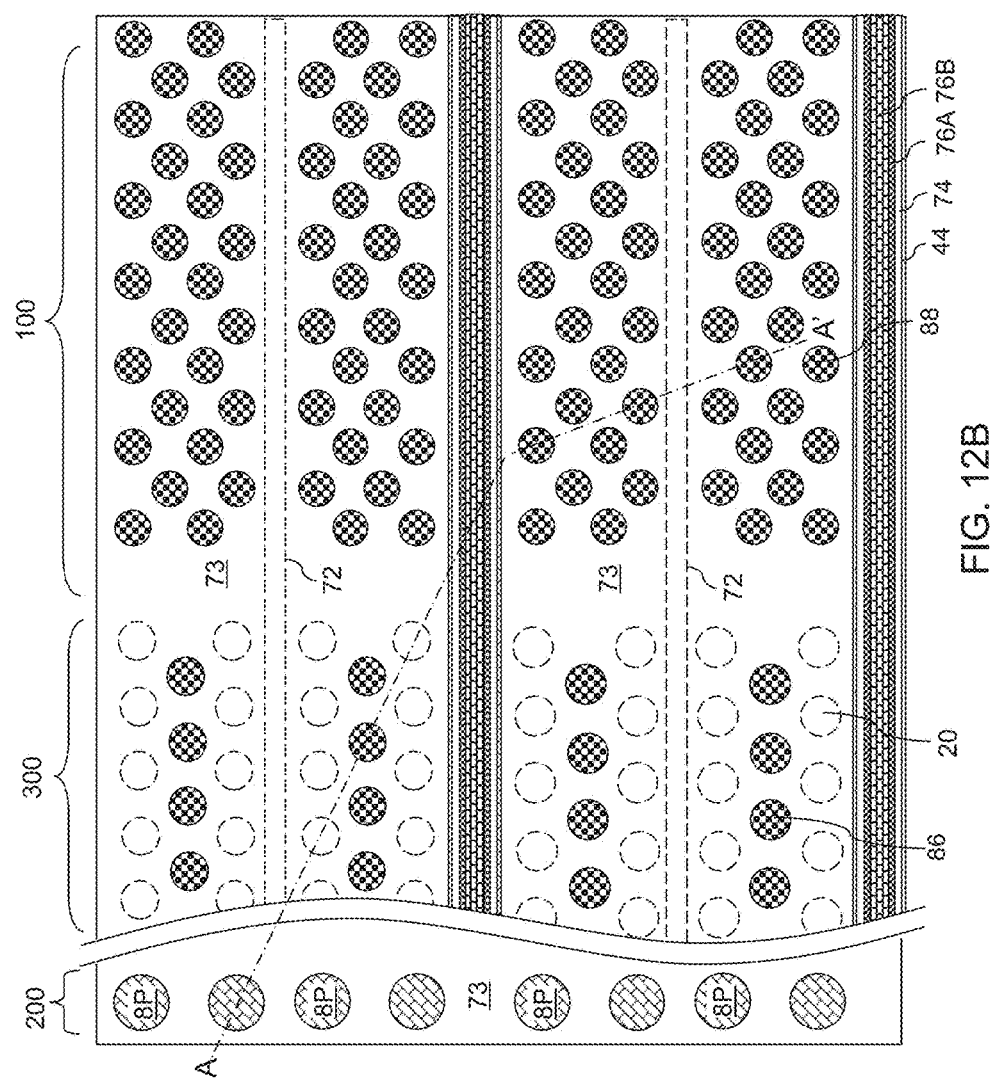
FIG. 12B is a top-down view of the exemplary structure of FIG. 12A. The plane A-A' is the plane of the vertical cross-section of FIG. 12A.
Figure 12D:
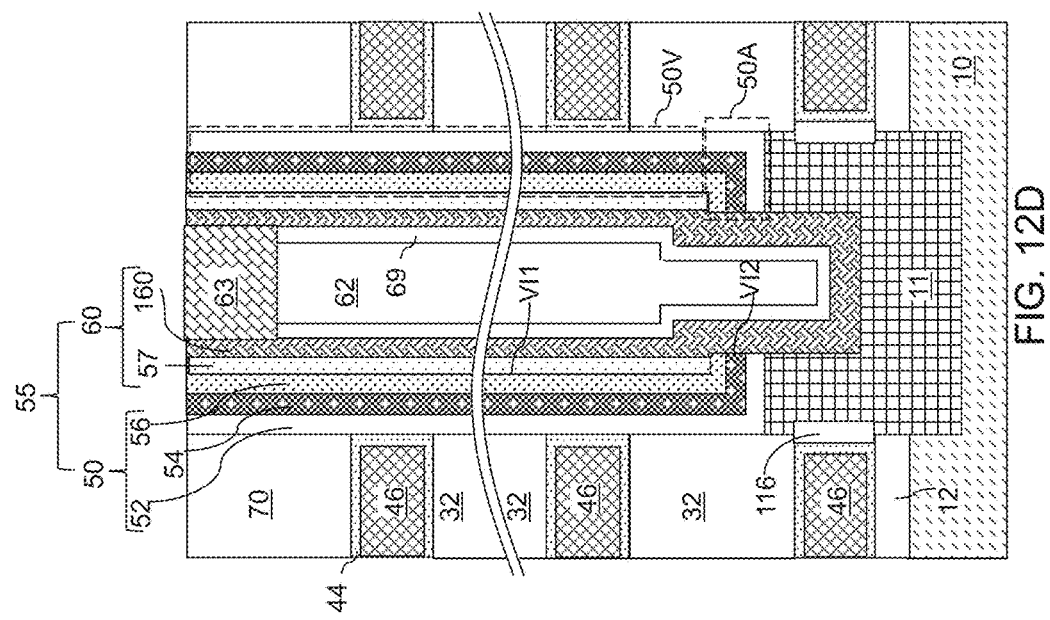
FIG. 12D is a magnified view of a memory opening of another exemplary structure according to an alternative embodiment.

Referring to FIGS. 12A and 12B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. The drain contact via structures 88 electrically connect the drain regions 63 to the bit lines (not shown) of the memory device. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

While an embodiment is illustrated herein in which the spacer material layers are formed as sacrificial material layers 42 and are subsequently replaced with electrically conductive layers 46, embodiments are expressly contemplated herein in which the spacer material layers are formed as electrically conductive layers 46. In this case, the processing steps employed to form, or fill, lateral recesses can be omitted.

The support pillar structures 20 can be dummy memory stack structures which contain the memory film 50 and the vertical channel 158 and which are formed at the same time as the memory stack structures 55. However, the dummy memory stack structures 20 are not electrically connected to bit lines and are used as support pillars rather than as NAND strings. Further, while the present disclosure is described employing an embodiment in which a support pillar structure 20 comprises a dummy structure has a same set of elements as a memory opening fill structure, embodiments are expressly contemplated herein in which a support pillar structure 20 includes a different set of material portions than a memory opening fill structure. In this case, support pillar structures including at least one dielectric material can be formed employing a set of processing steps that are different from the set of processing steps employed to form the memory opening fill structures.

The exemplary structure of the present disclosure can include a three-dimensional memory device, which includes: an alternating stack (32, 46) of insulating layers 32 and electrically conductive layers 46 located over a semiconductor substrate (9, 10); a memory opening 49 extending through the alternating stack (32, 42) to a top surface of the semiconductor substrate (9, 10); a germanium-containing epitaxial channel layer 158 in epitaxial alignment with a single crystalline structure of the semiconductor substrate (9, 10); and a memory film 50 located on the germanium-containing epitaxial channel layer 158 and in the memory opening 49.

In one embodiment, the memory film 50 comprises a layer stack including a charge storage layer 54 and a tunneling dielectric layer 56, and the germanium-containing epitaxial channel layer 158 contacts an inner sidewall of the tunneling dielectric layer 56.

In one embodiment shown in FIG. 12C, the memory film 50 includes a vertical tubular portion 50V that extends vertically through a predominant subset of layers within the alternating stack (32, 46), and an annular bottom portion 50A including an opening therein. The germanium-containing epitaxial channel layer 158 extends through the opening in the annular bottom portion 50A of the memory film 50. In one embodiment, a first vertical interface VI1 between the germanium-containing epitaxial channel layer 158 and the vertical tubular portion 50A of the memory film 50 is laterally offset from a second vertical interface VI2 between the germanium-containing epitaxial channel layer 158 and the annular bottom portion 50A of the memory film 50.

In one embodiment, the three-dimensional memory device further includes a dielectric layer 69 contacting an inner sidewall of the germanium-containing epitaxial channel layer 158. The germanium-containing epitaxial channel layer 158 has a substantially uniform thickness between the memory film 50 and the dielectric layer 69. A dielectric core 62 including silicon oxide can be located within the dielectric layer 69.

In one embodiment, the three-dimensional memory device can include a silicon-containing epitaxial pedestal 11 located between the semiconductor substrate (9, 10) and the germanium-containing epitaxial channel layer 158 within the memory opening 49 and in epitaxial alignment with the semiconductor substrate (9, 10) and with the germanium-containing epitaxial channel layer 158. In one embodiment, the silicon-containing epitaxial pedestal 11 comprises a recessed region including a recessed top surface that is located below an annular top surface of the silicon-containing epitaxial pedestal 11. A bottommost surface of the germanium-containing epitaxial channel layer 158 can contact the recessed top surface of the silicon-containing epitaxial pedestal 11.

In one embodiment, the silicon-containing epitaxial pedestal 11 can include silicon at an atomic concentration greater than 98%. In one embodiment, the silicon-containing epitaxial pedestal 11 can contact an annular bottom surface of the memory film 50.

In one embodiment, the germanium-containing epitaxial channel layer 158 includes germanium atoms at an atomic concentration greater than 10%. In one embodiment, the germanium-containing epitaxial channel layer 158 extends through a plurality of electrically conductive layers 46 and a plurality of insulating layers 32 within the alternating stack (32, 46).

In one embodiment, a drain region 63 including a polycrystalline doped semiconductor material can contact a top portion of the germanium-containing epitaxial channel layer 158.

In an alternative embodiment shown in FIG. 12D, the semiconductor cover layer 57, such as a polysilicon layer, is retained in the final device instead of being removed in the step shown in FIG. 5E. In this case, the channel 60 includes an outer polysilicon cover layer 57 which contacts an inner single crystal silicon-germanium alloy layer 160 that is described in the prior embodiments. Preferably, the polysilicon cover layer 57 is under tensile stress (i.e., which results in a tensile strain) due to the lattice mismatch with the silicon-germanium alloy layer 160. The tensile stress on the polysilicon cover layer 57 increases electron and hole mobility in layer 57 and thus in the entire channel 60.

In one embodiment, the alternating stack (32, 46) includes a terrace region in which each electrically conductive layer 46 other than a topmost electrically conductive layer 46 within the alternating stack (32, 46) laterally extends farther than any overlying electrically conductive layer 46 within the alternating stack (32, 46). The terrace region includes stepped surfaces of the alternating stack (32, 46) that continuously extend from a bottommost layer within the alternating stack (32, 46) to a topmost layer within the alternating stack (32, 46).

The exemplary structure can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 60), wherein at least one end portion 60 of each of the plurality of semiconductor channels (59, 60) extends substantially perpendicular to a top surface of the substrate (9, 10); and a plurality of charge storage elements (as embodied as charge trapping material portions). Each charge storage element can be located adjacent to a respective one of the plurality of semiconductor channels (59, 60).

The single crystalline germanium-containing vertical semiconductor channel embodied as the germanium-containing epitaxial channel layer 158 of the present disclosure provides a high mobility channel for increasing the on-current relative to prior art semiconductor channels employing polysilicon. The enhancement of the mobility is partly due to the single crystalline nature of the germanium-containing epitaxial channel layer 158 versus the polycrystalline nature of prior art polysilicon channels, and partly due to the reduced band gap of germanium or a silicon-germanium alloy in the germanium-containing epitaxial channel layer 158 with respect to the band gap of silicon in the prior art polysilicon channels. The enhanced on-current of the vertical field effect transistors of the present disclosure can be advantageously employed to enhance the operational speed of the three-dimensional memory device, or to reduce the size of the three-dimensional memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
an alternating stack of insulating layers and electrically conductive layers located over a semiconductor substrate;
a memory opening extending through the alternating stack to a top surface of the semiconductor substrate;
a germanium-containing epitaxial channel layer in epitaxial alignment with a single crystalline structure of the semiconductor substrate;
a memory film located on the germanium-containing epitaxial channel layer and in the memory opening;
a drain region contacting a top portion of the germanium-containing epitaxial channel layer and comprising a polycrystalline doped semiconductor material; and
a silicon-containing epitaxial pedestal located between the semiconductor substrate and the germanium-containing epitaxial channel layer within the memory opening and in epitaxial alignment with the semiconductor substrate and with the germanium-containing epitaxial channel layer.

2. The three-dimensional memory device of claim 1, wherein:
the memory film comprises a layer stack including a charge storage layer and a tunneling dielectric layer; and
the germanium-containing epitaxial channel layer contacts an inner sidewall of the tunneling dielectric layer.

3. The three-dimensional memory device of claim 1, wherein:
the memory film comprises a vertical tubular portion that extends vertically through a predominant subset of layers in the alternating stack, and an annular bottom portion including an opening therein, wherein the germanium-containing epitaxial channel layer extends through the opening in the annular bottom portion of the memory film; and
a first vertical interface between the germanium-containing epitaxial channel layer and the vertical tubular portion of the memory film is laterally offset from a second vertical interface between the germanium-containing epitaxial channel layer and the annular bottom portion of the memory film.

4. The three-dimensional memory device of claim 1, further comprising:
a dielectric layer contacting an inner sidewall of the germanium-containing epitaxial channel layer, wherein the germanium-containing epitaxial channel layer has a substantially uniform thickness between the memory film and the dielectric layer;
a dielectric core located within the dielectric layer and comprising silicon oxide.

5. The three-dimensional memory device of claim 1, wherein:
the silicon-containing epitaxial pedestal comprises a recessed region including a recessed top surface that is located below an annular top surface of the silicon-containing epitaxial pedestal;
a bottommost surface of the germanium-containing epitaxial channel layer contacts the recessed top surface of the silicon-containing epitaxial pedestal;
the silicon-containing epitaxial pedestal includes silicon at an atomic concentration greater than 98%; and
the silicon-containing epitaxial pedestal contacts an annular bottom surface of the memory film.

6. The three-dimensional memory device of claim 1, wherein the germanium-containing epitaxial channel layer comprises a single crystalline semiconductor layer which includes germanium atoms at an atomic concentration greater than 10%.

7. The three-dimensional memory device of claim 1, wherein the germanium-containing epitaxial channel layer consists essentially of doped or undoped germanium.

8. The three-dimensional memory device of claim 1, wherein the germanium-containing epitaxial channel layer extends through a plurality of electrically conductive layers and a plurality of insulating layers within the alternating stack.

9. The three-dimensional memory device of claim 1, wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
the array of monolithic three-dimensional NAND strings comprises:
a plurality of semiconductor channels, wherein at least one end portion of each of the plurality of semiconductor channels extends substantially perpendicular to a top surface of the substrate, and
a plurality of charge storage elements, each charge storage element located adjacent to a respective one of the plurality of semiconductor channels.

10. A three-dimensional memory device comprising:
an alternating stack of insulating layers and electrically conductive layers located over a semiconductor substrate;
a memory opening extending through the alternating stack to a top surface of the semiconductor substrate;
a germanium-containing epitaxial channel layer in epitaxial alignment with a single crystalline structure of the semiconductor substrate; and
a memory film located on the germanium-containing epitaxial channel layer and in the memory opening,
wherein the germanium-containing epitaxial channel layer comprises a silicon-germanium alloy which is under compressive stress.

11. The three-dimensional memory device of claim 10, further comprising an outer polysilicon channel layer which contacts at least a part of the germanium-containing epitaxial channel layer, wherein the outer polysilicon channel layer is under tensile stress.

12. The three-dimensional memory device of claim 10, wherein:
the memory film comprises a layer stack including a charge storage layer and a tunneling dielectric layer; and
the germanium-containing epitaxial channel layer contacts an inner sidewall of the tunneling dielectric layer.

13. The three-dimensional memory device of claim 10, wherein:
the memory film comprises a vertical tubular portion that extends vertically through a predominant subset of layers in the alternating stack, and an annular bottom portion including an opening therein, wherein the germanium-containing epitaxial channel layer extends through the opening in the annular bottom portion of the memory film; and
a first vertical interface between the germanium-containing epitaxial channel layer and the vertical tubular portion of the memory film is laterally offset from a second vertical interface between the germanium-containing epitaxial channel layer and the annular bottom portion of the memory film.

14. The three-dimensional memory device of claim 10, further comprising:
a dielectric layer contacting an inner sidewall of the germanium-containing epitaxial channel layer, wherein the germanium-containing epitaxial channel layer has a substantially uniform thickness between the memory film and the dielectric layer;
a dielectric core located within the dielectric layer and comprising silicon oxide.

15. The three-dimensional memory device of claim 10, wherein the germanium-containing epitaxial channel layer comprises a single crystalline semiconductor layer which includes germanium atoms at an atomic concentration greater than 10%.

16. The three-dimensional memory device of claim 10, wherein the germanium-containing epitaxial channel layer consists essentially of doped or undoped germanium.

17. The three-dimensional memory device of claim 10, wherein the germanium-containing epitaxial channel layer extends through a plurality of electrically conductive layers and a plurality of insulating layers within the alternating stack.

18. The three-dimensional memory device of claim 10, wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
the array of monolithic three-dimensional NAND strings comprises:
a plurality of semiconductor channels, wherein at least one end portion of each of the plurality of semiconductor channels extends substantially perpendicular to a top surface of the substrate, and
a plurality of charge storage elements, each charge storage element located adjacent to a respective one of the plurality of semiconductor channels.

* * * * *